US009728380B2

(12) United States Patent
Mohn et al.

(10) Patent No.: US 9,728,380 B2
(45) Date of Patent: Aug. 8, 2017

(54) DUAL-PLENUM SHOWERHEAD WITH INTERLEAVED PLENUM SUB-VOLUMES

(71) Applicant: Novellus Systems, Inc., Fremont, CA (US)

(72) Inventors: Jonathan D. Mohn, Saratoga, CA (US); Shawn M. Hamilton, Boulder Creek, CA (US); Harald te Nijenhuis, San Jose, CA (US); Jeffrey E. Lorelli, Fremont, CA (US); Kevin Madrigal, Santa Cruz, CA (US)

(73) Assignee: Novellus Systems, Inc., San Jose, CA (US)

( * ) Notice: Subject to any disclaimer, the term of this patent is extended or adjusted under 35 U.S.C. 154(b) by 60 days.

(21) Appl. No.: 14/802,027

(22) Filed: Jul. 17, 2015

(65) Prior Publication Data

US 2016/0020074 A1     Jan. 21, 2016

Related U.S. Application Data

(62) Division of application No. 13/631,364, filed on Sep. 28, 2012, now Pat. No. 9,121,097.

(Continued)

(51) Int. Cl.
*B05B 1/26* (2006.01)
*H01J 37/32* (2006.01)
*C23C 16/455* (2006.01)

(52) U.S. Cl.
CPC .. *H01J 37/32633* (2013.01); *C23C 16/45565* (2013.01); *C23C 16/45589* (2013.01); *H01J 37/3244* (2013.01)

(58) Field of Classification Search
CPC .. F23D 11/32; A01G 2/00; B05B 5/00; B05B 1/14; C23C 16/00; C23C 16/5096; C23C 16/45563; C23C 16/45565; C23C 16/4557; C23C 16/45572; H01J 37/32091; H01J 37/3244; H01J 37/32559
USPC .... 239/518, 519, 523, 546, 587.1, 602, 590, 239/590.3, 596, 1, 553.3, 556, 558, 568, 239/690, 690.1, 706, 548; 118/715, 118/723 K, 723 VE, 723 E, 723 R; 156/345.34, 345, 345.33, 345.48; 438/714; 216/67; 204/298.07, 298.33
See application file for complete search history.

(56) References Cited

U.S. PATENT DOCUMENTS 3,854,443 A * 12/1974 Baerg .................... C23C 16/455
                                                    118/724
4,612,077 A    9/1986 Tracy et al.
(Continued)

OTHER PUBLICATIONS

U.S. Notice of Allowance dated Apr. 20, 2015, in U.S. Appl. No. 13/631,364.
(Continued)

*Primary Examiner* — Justin Jonaitis
(74) *Attorney, Agent, or Firm* — Weaver Austin Villeneuve & Sampson LLP

(57) ABSTRACT

Apparatuses and techniques for providing for variable radial flow conductance within a semiconductor processing showerhead are provided. In some cases, the radial flow conductance may be varied dynamically during use. In some cases, the radial flow conductance may be fixed but may vary as a function of radial distance from the showerhead centerline. Both single plenum and dual plenum showerheads are discussed.

20 Claims, 15 Drawing Sheets

Related U.S. Application Data

(60) Provisional application No. 61/695,975, filed on Aug. 31, 2012.

(56) References Cited

U.S. PATENT DOCUMENTS

| | | | |
|---|---|---|---|
| 4,792,378 A | 12/1988 | Rose et al. | |
| 4,820,371 A | 4/1989 | Rose | |
| 5,027,746 A * | 7/1991 | Frijlink | C30B 25/14 |
| | | | 118/715 |
| 5,624,498 A * | 4/1997 | Lee | C23C 16/45565 |
| | | | 118/715 |
| 5,935,337 A * | 8/1999 | Takeuchi | C23C 16/45565 |
| | | | 118/715 |
| 5,950,925 A * | 9/1999 | Fukunaga | C23C 16/45512 |
| | | | 118/715 |
| 6,245,192 B1 | 6/2001 | Dhindsa et al. | |
| 6,415,736 B1 | 7/2002 | Hao et al. | |
| 6,983,892 B2 | 1/2006 | Noorbakhsh et al. | |
| D641,829 S | 7/2011 | Angelov et al. | |
| 8,066,895 B2 | 11/2011 | Belen et al. | |
| 8,137,467 B2 | 3/2012 | Meinhold et al. | |
| 8,673,080 B2 | 3/2014 | Meinhold et al. | |
| 9,121,097 B2 | 9/2015 | Mohn et al. | |
| 2005/0011447 A1 | 1/2005 | Fink | |
| 2008/0185104 A1 * | 8/2008 | Brcka | H01J 37/32357 |
| | | | 156/345.29 |
| 2008/0282979 A1 * | 11/2008 | Chen | H01J 37/32192 |
| | | | 118/722 |
| 2009/0095218 A1 | 4/2009 | Meinhold et al. | |
| 2009/0095219 A1 | 4/2009 | Meinhold et al. | |
| 2009/0095220 A1 | 4/2009 | Meinhold et al. | |
| 2009/0260571 A1 | 10/2009 | Ostrowski et al. | |
| 2011/0052833 A1 * | 3/2011 | Hanawa | C23C 16/4404 |
| | | | 427/534 |
| 2011/0146571 A1 | 6/2011 | Bartlett et al. | |
| 2012/0108072 A1 | 5/2012 | Angelov et al. | |
| 2012/0122302 A1 * | 5/2012 | Weidman | C23C 16/325 |
| | | | 438/478 |
| 2013/0334344 A1 | 12/2013 | Lesser et al. | |
| 2013/0341433 A1 | 12/2013 | Roy et al. | |
| 2014/0061324 A1 | 3/2014 | Mohn et al. | |
| 2014/0099794 A1 | 4/2014 | Ingle et al. | |
| 2014/0158792 A1 | 6/2014 | Meinhold et al. | |
| 2014/0179114 A1 | 6/2014 | Van Schravendijk | |
| 2014/0235069 A1 | 8/2014 | Breiling et al. | |

OTHER PUBLICATIONS

U.S. Corrected Notice of Allowability dated May 29, 2015, in U.S. Appl. No. 13/631,364.

U.S. Restriction Requirement dated Jan. 2, 2015, in U.S. Appl. No. 13/631,364.

* cited by examiner

DUAL-PLENUM SHOWERHEAD WITH INTERLEAVED PLENUM SUB-VOLUMES

CROSS-REFERENCE TO RELATED APPLICATION

This application is a divisional application of, and claims priority under 35 U.S.C. §120 to, U.S. patent application Ser. No. 13/631,364, filed Sep. 28, 2012, which claims benefit of priority under 35 U.S.C. §119(e) to U.S. Provisional Patent Application No. 61/695,975, entitled "VARIABLE SHOWERHEAD FLOW BY VARYING INTERNAL BAFFLE CONDUCTANCE" filed Aug. 31, 2012, both of which are hereby incorporated herein by reference in their entireties and for all purposes.

BACKGROUND OF THE INVENTION

Semiconductor processing tools often use components called "showerheads" to distribute process gases, e.g., reactants, across a semiconductor substrate during processing. A typical showerhead may include a faceplate that forms one wall of an internal plenum; the faceplate may generally be oriented to be parallel to, and facing, a substrate being processed using the showerhead. The faceplate may have a large number of gas distribution holes arrayed across it, and gases introduced into the internal plenum may flow through the gas distribution holes and towards a substrate or substrates processed using the showerhead.

SUMMARY OF THE INVENTION

The systems, methods and devices of the disclosure each have several innovative aspects, no single one of which is solely responsible for the desirable attributes disclosed herein. One innovative aspect of the subject matter described in this disclosure can be implemented in a variety of ways.

In some implementations, a baffle for a showerhead of a semiconductor processing tool may be provided. The baffle may be configured for mounting within the showerhead such that a lower plenum volume is formed between a bottom surface of the baffle and a faceplate of the showerhead and such that an upper plenum volume is formed between a top surface of the baffle and an interior surface of the showerhead. The baffle may be configured such that gas that is introduced into the upper plenum volume during semiconductor processing operations flows through the baffle, into the lower plenum volume, and then through gas distribution holes in the faceplate and towards a semiconductor substrate subject to the semiconductor processing operations. The baffle may include a plate, the plate substantially axially symmetric about a center axis of the baffle with one side of the plate forming the bottom surface of the baffle. The bottom surface may be non-parallel to a reference plane normal to the center axis in a region of the plate defining the lower plenum volume. The baffle may also include a plurality of through-holes arranged in a radial array, the radial array centered on the center axis.

In some implementations of the baffle, the bottom surface of the plate may define a conical frustum with a cone angle of between 170 and 179.9 degrees. In some further implementations of the baffle, the radial array may have a diameter of approximately half of the diameter of the plate.

In some implementations of the baffle, the plate may include a linear displacement mechanism interface feature configured to interface with a movable end of a linear displacement mechanism. In some further implementations of such a baffle, the linear displacement mechanism interface feature may be a center post, the center post centered on the center axis and protruding from a side of the plate opposite the bottom surface and in a direction away from the bottom surface.

In some implementations of the baffle, the baffle may be made from aluminum. In other implementations of the baffle, the baffle may be made from a polymeric material.

In some implementations, a showerhead for use in a semiconductor processing tool may be provided. The showerhead may include a faceplate and a baffle. The faceplate may include a faceplate bottom surface and a faceplate top surface opposite the faceplate bottom surface. The faceplate top surface may partially define a lower plenum volume within the showerhead. The showerhead may be configured such that, when the showerhead is used in a semiconductor manufacturing process, the faceplate bottom surface is oriented so as to face a semiconductor substrate subject to the semiconductor manufacturing process. The baffle may include a plate with a substantially axially-symmetric shape about a center axis substantially normal to the faceplate, the plate having a baffle bottom surface facing the faceplate and a baffle top surface facing away from the baffle bottom surface. The baffle bottom surface may further define the lower plenum volume and the baffle top surface may partially define an upper plenum volume. The baffle may also include a plurality of through-holes arranged in a radial array, the radial array centered on the center axis.

In some implementations, the showerhead may further include a linear displacement mechanism configured to displace a center region of the plate by a first distance along the center axis while an edge region of the plate is substantially fixed with respect to motion along the center axis. In some such implementations, the linear displacement mechanism may be a computer-controlled linear actuator or screw drive. Alternatively (or additionally), in some such implementations, the linear displacement mechanism may include a threaded rod configured to be manually rotated.

In some implementations, the showerhead may further include a center post, the center post centered on the center axis and protruding from the top surface of the baffle. In some such implementations, the center post may protrude through a seal in a back face of the showerhead and the seal may be configured to permit sliding motion of the center post along the center axis with respect to the seal. In some such implementations, the showerhead may further include a linear displacement mechanism configured to displace a center region of the plate by a first distance along the center axis while an edge region of the plate is substantially fixed with respect to motion along the center axis, the linear displacement mechanism fluidically isolated from the lower plenum volume and the upper plenum volume by the seal.

In some implementations of the showerhead, the baffle bottom surface may define a conical frustum with a cone angle of between 170 and 179.9 degrees.

In some implementations of the showerhead, the radial array may have a diameter of approximately half of the diameter of the plate.

In some implementations of the showerhead, a first radial flow conductance may exist between the faceplate and the baffle when the plate is in an undisplaced state, and a second radial flow conductance may exist between the faceplate and the baffle when the plate is displaced by the first distance from the undisplaced state. The second radial flow conductance may exhibit less radial flow conductance near the center axis than the first radial flow conductance.

In some implementations, a showerhead for use in a semiconductor processing tool may be provided. The showerhead may include a faceplate and a plurality of gas distribution holes distributed across the faceplate. The faceplate may include a faceplate top surface partially defining a plenum volume of the showerhead and a faceplate bottom surface configured to be facing a semiconductor substrate during a semiconductor processing operation performed using the semiconductor processing tool. The showerhead may also include mechanical displacement means for adjusting radial flow conductance across the faceplate top surface.

In some implementations, a showerhead for use in a semiconductor processing tool may be provided. The showerhead may include a faceplate, a plurality of gas distribution holes distributed across the faceplate, and a baffle. The faceplate may include a faceplate top surface partially defining a plenum volume of the showerhead and a faceplate bottom surface configured to be facing a semiconductor substrate during a semiconductor processing operation performed using the semiconductor processing tool. The baffle may be offset from the faceplate top surface, may be substantially centered with respect to the faceplate, and may include a baffle top surface and a baffle bottom surface facing the faceplate top surface. A separation gap between the baffle bottom surface and the faceplate top surface may vary with respect to radial position such that the radial flow conductance between the faceplate top surface and the baffle bottom surface varies with respect to radial position.

In some implementations, method for providing a showerhead with a variable radial flow conductance is provided. The method may include introducing a process gas into a first plenum volume between a baffle within the showerhead and a faceplate of the showerhead, where the baffle may include a pattern of passages through the baffle through which the process gas is introduced into the first plenum volume, the faceplate may include a pattern of gas distribution holes configured to deliver gas from the first plenum volume across the surface of a semiconductor substrate, and the baffle may be offset from the faceplate and supported about the baffle's outer edge by the showerhead. The method may further include displacing the center of the baffle to induce flexure of the baffle and to produce changes in separation distance between the baffle and the faceplate that vary as a function of radial distance from a center axis of the faceplate.

The method may further include determining the profile of the baffle when the baffle is displaced and manufacturing a new baffle that possesses the determined profile in an un-displaced state.

In some implementations, a dual-plenum showerhead for use in a semiconductor processing tool may be provided. The showerhead may include a first gas feed tube with a first interior volume and a first inlet configured to feed gas to the first interior volume and a second gas feed tube. The first gas feed tube may be concentric with the second gas feed tube, thereby creating an annular, second interior volume between the first gas feed tube and the second gas feed tube. The second gas feed tube may have a second inlet configured to feed gas to the second interior volume, and the first gas feed tube may be of a smaller diameter than the second gas feed tube. The first interior volume may also be fluidly isolated from the second interior volume within the second gas feed tube. A dual plenum volume may be substantially defined by an outer wall, the outer wall substantially axially symmetric about a first axis. The dual plenum volume may be divided into an even number of sub-volumes by radial barriers substantially extending from the first gas feed tube to the outer wall. In such an implementation, the first axis may be substantially centered on the faceplate, a bottom portion of the outer wall may face the faceplate, each sub-volume may have a plurality of plenum gas distribution holes passing through the bottom portion, and every odd sub-volume may be fluidly connected to the first gas feed tube by a first radial passage, thereby forming a first plenum volume. Additionally, every even sub-volume may be fluidly connected to the second gas feed tube by a second radial passage, thereby forming a second plenum volume, and the first plenum volume may be fluidly isolated from the second plenum volume between the plenum gas distribution holes and the first gas inlet.

In some implementations of the dual-plenum showerhead, the sub-volumes may all be substantially the same size and overall shape.

In some implementations of the dual-plenum showerhead, the sub-volumes may decrease in height along the first axis as a function of radial position with respect to the first axis.

In some implementations of the dual-plenum showerhead, the sub-volumes may increase in height along the first axis as a function of radial position with respect to the first axis.

In some implementations of the dual-plenum showerhead, there may be at least 10 sub-volumes.

In some implementations of the dual-plenum showerhead, the showerhead may further include a faceplate. The faceplate may include a plurality of gas distribution holes through the faceplate and may be positioned such that openings of the gas distribution holes face the plenum gas distribution holes in the outer wall. In some such implementations, the faceplate may be offset from the outer wall by a gap.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

BRIEF DESCRIPTION OF THE DRAWINGS

FIGS. 3A-3D and 7A-11C are scaled drawings, although the drawing scale may vary from Figure to Figure (the proportions within each Figure are still to-scale, however).

DETAILED DESCRIPTION

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of the invention as defined by the appended claims. In the following description, numerous implementation-specific details are set forth in order to provide a thorough understanding of the present invention. The present invention may be practiced without some or all of these implementation-specific details. In other instances, well-known process operations have not been described in detail in order not to unnecessarily obscure the present invention.

Figure 1:
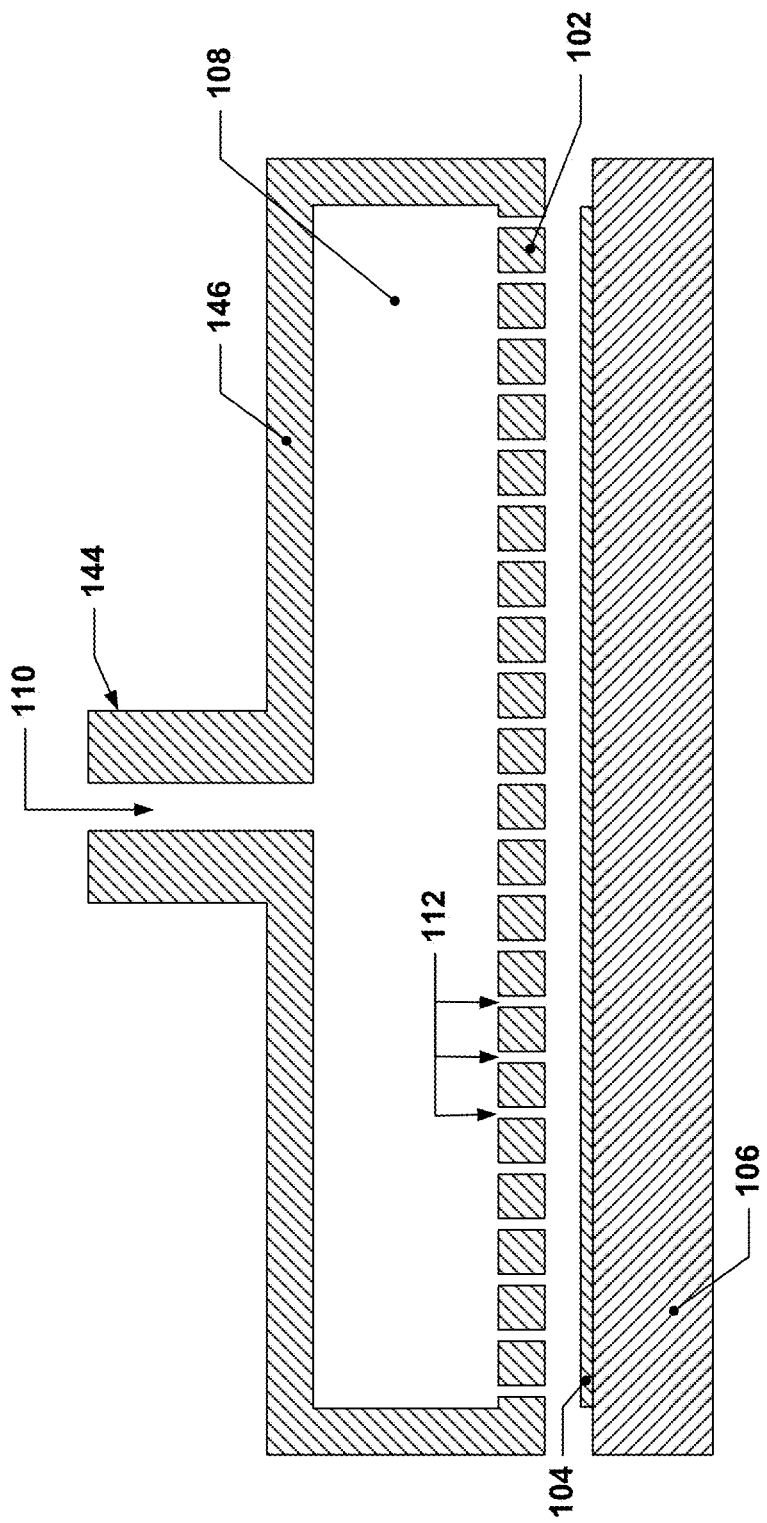
FIG. 1 depicts a high-level schematic section view of a typical example showerhead.

FIG. 1 depicts a high-level schematic section view of a typical example showerhead. Showerhead 100 may include a faceplate 102 with a faceplate top surface 138 and a faceplate bottom surface 136. A pattern of gas distribution holes 112 may allow for fluidic communication between a plenum volume 108 formed within the showerhead 100 and a processing region interposed between the faceplate 102 and a semiconductor substrate 104. The semiconductor substrate 104 may be supported by a substrate support 106. A gas inlet 110 may allow for semiconductor processing gases to be introduced to the plenum volume 108 and then distributed across the semiconductor substrate 104 via the gas distribution holes 112. The showerhead 100, semiconductor substrate 104, and substrate support 106 may be housed within a semiconductor processing chamber or reactor (not shown) that is part of a semiconductor processing tool (also not shown).

While the typical showerhead 100 of FIG. 1 is most similar to a "chandelier" type showerhead, e.g., the showerhead may be suspended from the top of a semiconductor processing chamber by a stem 144, the techniques and mechanisms discussed herein may, in addition to being used in chandelier-type showerheads, be used in "flush-mount" type showerheads, e.g., showerheads that, instead of being supported by a stem near the center of the showerhead, are supported about the periphery of the showerhead and that may form part of the roof of a semiconductor processing chamber. This disclosure is to be understood to apply to variable flow conductance mechanisms suitable for use with either type of showerhead.

During operation of a typical showerhead, the process gas that is distributed across the surface of a semiconductor substrate may be distributed in a non-uniform manner due to the internal geometry of the showerhead, the manner in which the process gas is routed to the gas distribution holes, etc. Various techniques have been used to tune the distribution of such process gases, including varying the arrangement of gas distribution holes across the faceplate, introducing "dual zone" showerheads where the gas distribution holes are separated into a center grouping and an annular outer grouping, each fed by a different plenum and supplied with process gases at different concentrations and/or flow rates, and by adjusting the size of the gas distribution holes.

Presented herein are techniques and mechanisms for adjusting the amount of process gas that flows out of the gas distribution holes of a showerhead by varying the radial flow conductance of the process gases within the showerhead. Such techniques and mechanisms allow for the flow rates of process gases delivered across a semiconductor substrate to be precisely tuned or adjusted without requiring re-machining of showerhead components, and, in some implementations, allow for such flow rates to be adjusted mid-process. This allows for enhanced uniformity across the semiconductor substrate, e.g., more uniform deposition layer thickness or etch removal thickness.

Figure 2A:
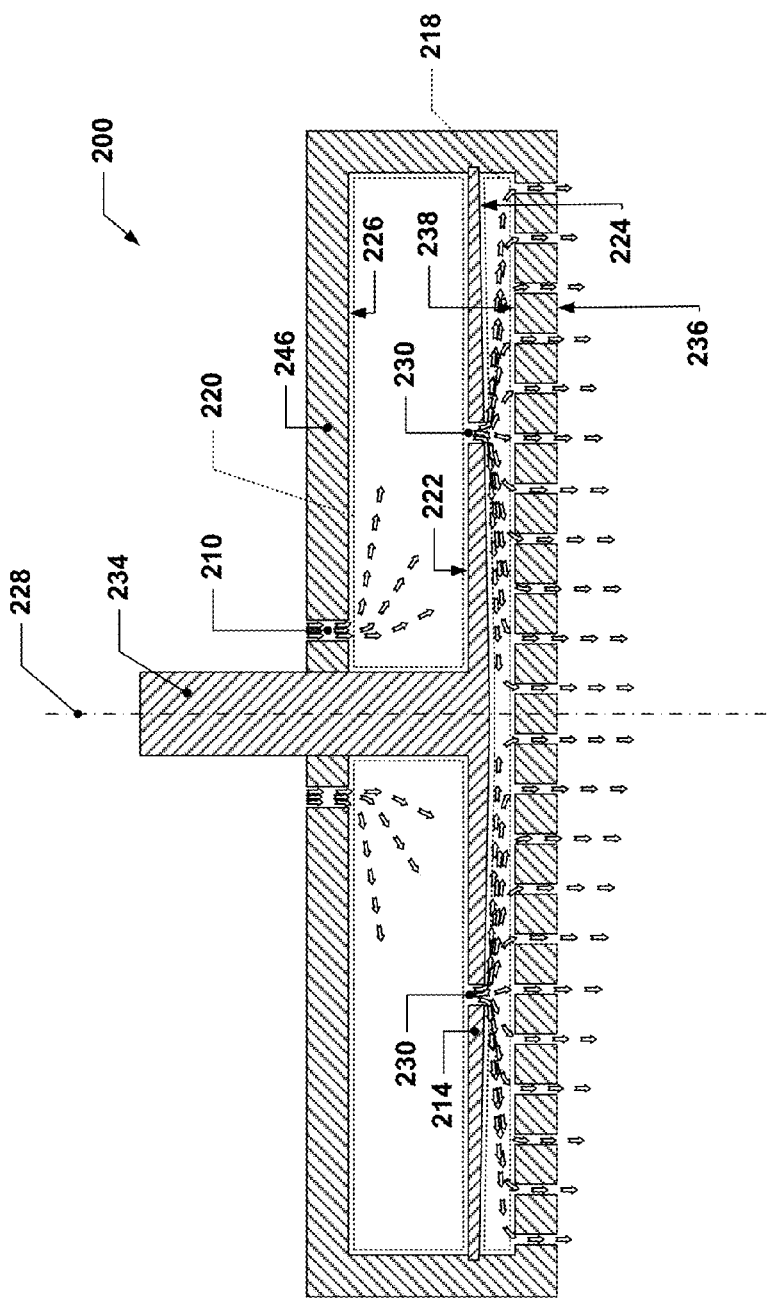
FIG. 2A depicts a conceptual section view of an example of a showerhead configured to provide variable radial flow conductance within the showerhead using a flexible baffle.

FIG. 2A depicts a conceptual section view of an example of a showerhead configured to provide variable radial flow conductance within the showerhead using a flexible baffle. A showerhead 200 is shown with a faceplate 202 (the faceplate 202 is shown as an integral part of the showerhead 200, but, in practice, may be a removable faceplate or may be a separate part welded onto the showerhead main body). The showerhead 200 may also include a baffle 214 that divides the internal volume of the showerhead 200 into two volumes: a lower plenum volume 218 and a upper plenum volume 220. The baffle 214 may be supported about its outer perimeter by the showerhead 200. Such support may, for example, be a simple support, a cantilevered (clamped on top and bottom by the showerhead 200 or welded/bonded to the showerhead 200) support, or be provided by, for example, threaded fasteners that secure the baffle 214 to the showerhead 200.

The faceplate 202 may have a faceplate bottom surface 236 and a faceplate top surface 238. The faceplate bottom surface 236 may be configured to face towards a substrate (not shown) processed using the showerhead 200. The faceplate top surface 238, along with a baffle bottom surface 224, may be configured to partially (or wholly) define the lower plenum volume 218. A baffle top surface 222 may correspondingly partially define the upper plenum volume 220. The upper plenum volume 220 may also be partially defined by an interior surface 226 of the showerhead 200.

Process gas may be introduced into the upper plenum volume 220 via one or more gas inlets 210. The process gas may then flow through the baffle 214 through, for example, a radial array of through-holes 230 located approximately mid-diameter on the baffle 214. It is to be understood that other arrangements of through-holes 230 (including other shapes of through-holes) may be used as well, although such arrangements may generally be configured to produce a gas flow into the lower plenum volume that is substantially axially symmetric about a center axis 228 of the showerhead 200. For example, in some implementations, the radial array of through-holes 230 may be located near the perimeter of the baffle rather than at approximately the mid-diameter.

In the implementation shown, the baffle 214 has the general shape of a circular plate with a slight taper on the baffle bottom surface 224, which gives the baffle bottom surface 224 the appearance of a very shallow, conical frustum. Due to this slight taper, the separation distance between the faceplate top surface 238 and the baffle bottom surface 224 decreases with radial position as the point of separation distance measurement approaches the center axis 228. This has the effect of reducing the cross-sectional area through which gas flowing radially towards the center axis 228 and between the faceplate top surface 238 and the baffle bottom surface 224 may flow, i.e., reducing the flow conductance or increasing the flow resistance experienced by the process gas as it flows towards the center axis 228.

Other contours may be used for the baffle bottom surface 224 as well, including simple, flat profiles that do not reduce the separation distance between the faceplate top surface 238 and the baffle bottom surface 224. The baffle may also be contoured along the top surface instead of, or in addition to, the bottom surface 224, and the contours used may also be non-linear contours (as opposed to linear, tapered contours).

Regardless of what profile is used for the baffle bottom surface 224, the resulting radial flow conductance may be altered by applying a force to a center region of the baffle top surface 222 and causing the baffle 214 to flex in a substantially axially-symmetric manner. This may have the effect of causing the separation distance between the faceplate top surface 238 and the baffle bottom surface 224 to change by varying amounts in the radial direction. The change in separation distance may be most acute along the center axis 228, and may be minimal or non-existent at the edge of the baffle 214, i.e., where the baffle 214 is supported by the showerhead 200.

For example, in FIG. 2A, the baffle 214 is shaped to provide a radial flow conductance in the un-flexed state that causes a greater amount of process gas to be delivered through the center region of the faceplate 202, as indicated by the arrows/flow paths of greater length towards the center region of the faceplate 202 as compared with the arrows/flow paths of shorter length towards the perimeter of the faceplate 202.

Figure 2B:
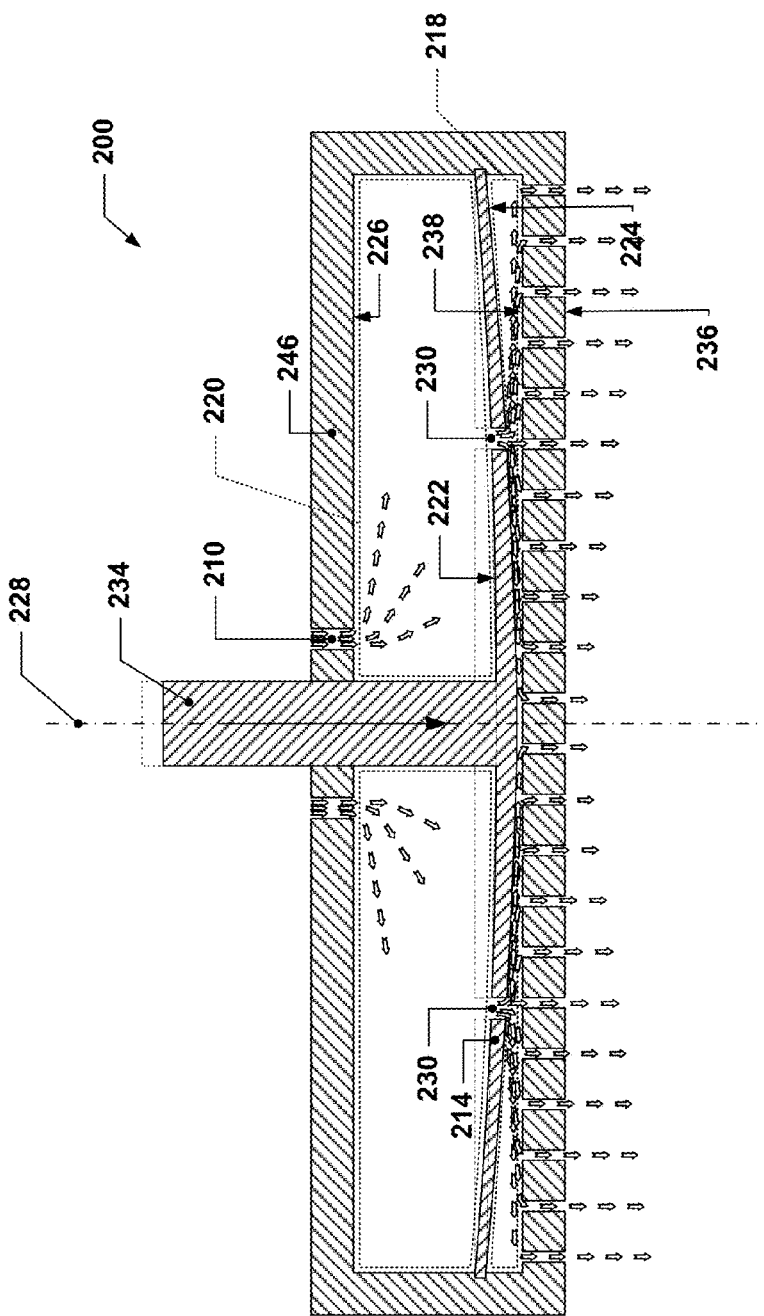
FIG. 2B depicts a conceptual section view of the example showerhead from FIG. 2A with the flexible baffle in a displaced condition.

In FIG. 2B, the center region of the baffle 214 has been displaced towards the faceplate 202 by a distance roughly corresponding to the thickness of the baffle 214 (this distance may not be representative of the actual amount of deflection that may be used; for example, the displacement may be on the order of thousandths or hundredths of an inch). For reference, the outline of the un-displaced baffle is shown with a dashed line. This may cause the radial flow conductance between the faceplate top surface 238 and the baffle bottom surface 224 to decrease substantially closer to the center axis 228. In turn, this may cause a greater amount of process gas to be delivered through the gas distribution holes 230 closer to the edge region of the faceplate 202 than is delivered through the gas distribution holes 230 near the center of the faceplate 202. Again, this flow pattern is illustrated by the use of arrows/flow paths of varying lengths across the span of the faceplate 202.

Such displacement of the baffle 214 may be effected through a linear displacement mechanism such as, for example, a screw-driven linear actuator, a cam- or wedge-actuator, or a hydraulic actuator. Other linear displacement mechanisms also may be used if appropriate. Such linear displacement mechanisms may, in general, exhibit a high degree of precision and accuracy in terms of the linear displacement they effect, and may be capable of very small displacements, e.g., on the order of thousandths of an inch.

The displacement force may be delivered to the baffle 214 through a linear displacement mechanism interface feature such as, for example, center post 234. The center post 234 may, for example, protrude through a seal (not shown) in the backplate 246 of the showerhead 200. The seal may provide a sliding seal interface between the backplate 246 and the center post 234 that fluidly isolates whatever linear displacement mechanism is used to displace the baffle 214 from the process gases present in the upper plenum volume. The seal may also serve to isolate the lower plenum volume 218 and the upper plenum volume 220 from any contaminants that may be produced by the linear displacement mechanism and the interaction of the linear displacement mechanism with the linear displacement mechanism interface feature, e.g., lubricants, dust, etc.

In some implementations, the baffle top surface may be connected, for example, to the showerhead by a bellows device located within any pattern of through-holes in the baffle. The bellows device may allow the center of the baffle to flex relative to the showerhead while keeping the center of the baffle, as well as any linear displacement mechanism components and linear displacement mechanism interface features, isolated from the upper plenum volume and any process gases contained therein.

In some implementations, the linear displacement mechanism interface feature may be configured to transmit only compressive axial force to the baffle. For example, the baffle (or center post) may include a recess or other receptacle configured to receive, for example, the end of a linear screw actuator shaft. When the baffle is elastically deflected by a force applied using the linear displacement mechanism, the baffle will exert a corresponding force in the opposite direction and will maintain a contact relationship with the linear displacement mechanism. When the linear displacement mechanism force is removed, the baffle may then return to its unstressed (or less-stressed) state.

In other implementations, the linear displacement mechanism interface feature may be configured to transmit both compressive and tensile force to the baffle. Such implementations may allow for the baffle to be "pulled away" from the faceplate as well as "pushed towards" the faceplate. This may provide the showerhead with additional radial flow conductance tuning flexibility. Such interface features may, for example, include receptacles with positive capture features, e.g., ball-and-socket joints, welds, etc., that transmit both types of force to the baffle.

The linear displacement mechanism may be powered or unpowered. A powered linear displacement mechanism may be used to actively control the radial flow conductance during semiconductor processing. For example, the linear displacement mechanism may be a precision electromechanical linear screw drive coupled to a controller that is either in communication with a controller for a semiconductor processing tool that houses the showerhead or that is part of such a controller. The controller may be configured to engage (or disengage) the linear displacement mechanism at various points during a semiconductor process so as to dynamically alter the flow characteristics of process gases through the showerhead. For example, a semiconductor processing technique may include delivering two different process gases sequentially. The first process gas may require more delivery towards the center of the semiconductor substrate, and the second process gas may require more delivery towards the perimeter of the substrate. By engaging the linear displacement mechanism to displace the baffle towards the faceplate in between the delivery of the first and second process gases, the radial flow conductance may be shifted such that the desired flow patterns are produced. This may be done without swapping out showerhead faceplates or using multiple showerheads, and in a matter of seconds or less.

Unpowered linear displacement mechanisms may also be used. Such linear displacement mechanisms may allow for a human operator to precisely adjust the degree of radial flow conductance through the use of hand tools, e.g., a spanner, wrench, or other equipment. Unpowered implementations may not allow for in-process changes of flow conductance, but may allow for a human operator to tune a particular showerhead flow profile as needed for a particular process, and then make periodic adjustments as needed to account for showerhead degradation or re-purposing for different semiconductor processes.

In some implementations, showerheads with manually-driven linear displacement mechanisms may be provided that are configured to be retrofitted with a powered linear displacement mechanism (and/or controller).

Figure 3A:
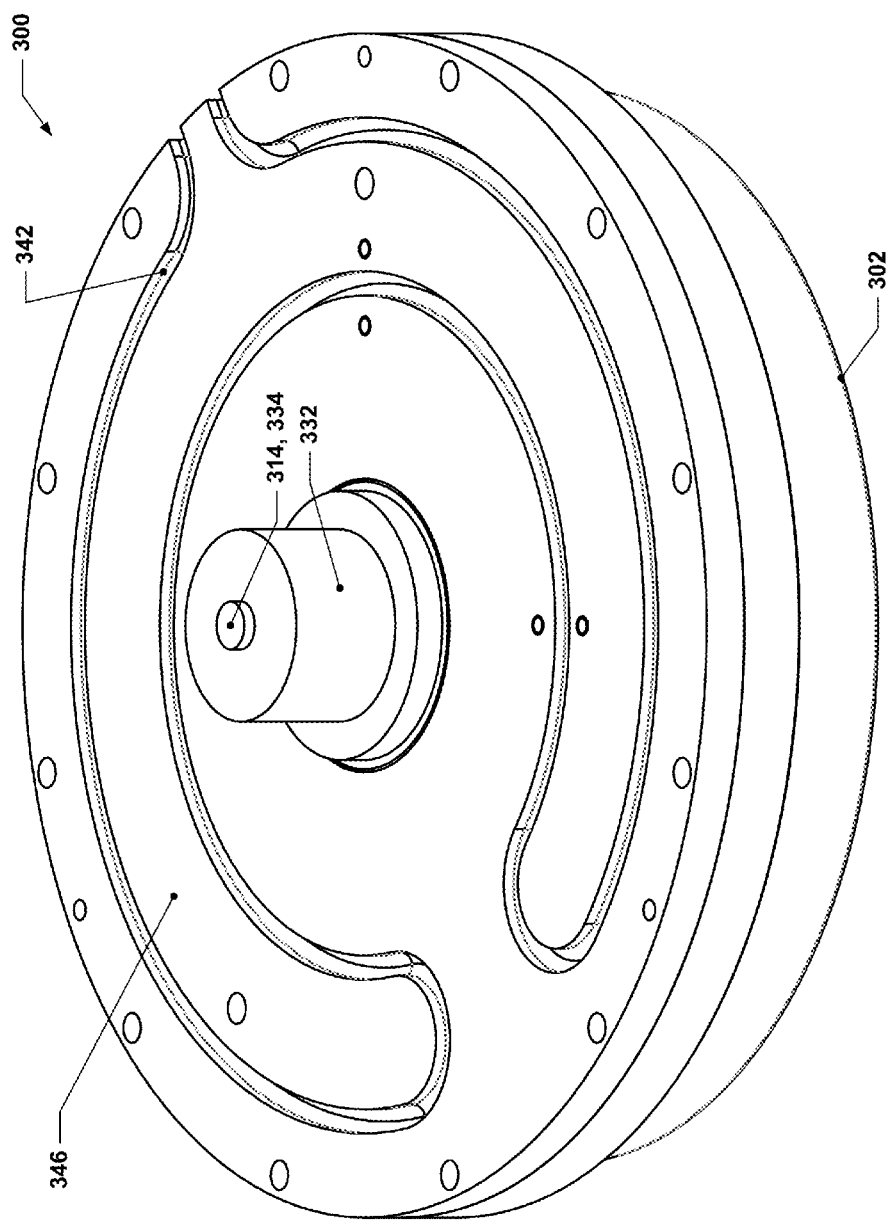
FIG. 3A depicts an isometric view of an example of a showerhead configured to provide variable radial flow conductance.
Figure 3B:
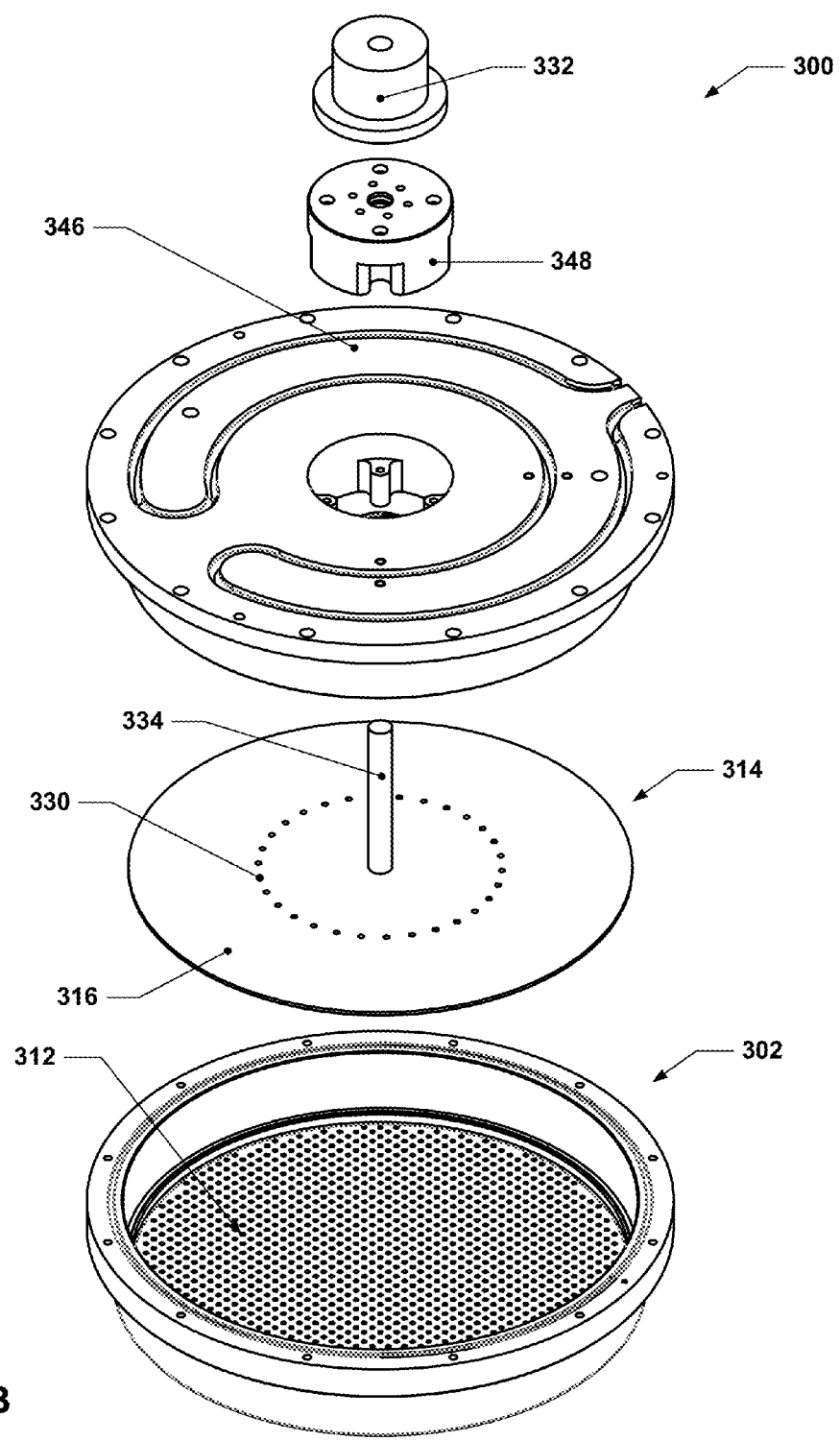
FIG. 3B depicts an isometric exploded view of the example showerhead from FIG. 3A.

A second example implementation of a showerhead that is configured to provide variable radial flow conductance is discussed below. FIG. 3A depicts an isometric view of an example of a showerhead configured to provide variable radial flow conductance. FIG. 3B depicts an isometric exploded view of the example showerhead from FIG. 3A.

The showerhead 300 shown is a flush-mount showerhead, and includes a double-C shaped heater loop channel 342 that is configured to receive a resistive heater element (not shown). Also visible is an insert 348, which may be used to provide, for example, process gas inlets (not shown) and a feed-through for a center post 334 that interfaces with a linear displacement mechanism 332. The showerhead 300 includes a back plate 346 and a faceplate 302, as well as a baffle 314. The baffle 314 may include a plate 316, a center post 334, and a circular array of through-holes 330. The circular array of through-holes 330 may be located approximately mid-diameter on the plate 316. The baffle 314 may be interposed between the back plate 346 and the faceplate 302. The faceplate 302 may include a plurality of gas distribution holes 312. In the pictured implementation, the gas distribution holes 312 are arrayed in a square grid with 0.3" hole spacing; the gas distribution holes 312 in this implementation are approximately 0.02" in diameter. In other implementations, other sizes and patterns of gas distribution holes may be used, e.g., spiral patterns, variable density patterns, concentric circular patterns, etc.

The gas distribution hole pattern used may be selected based on the steady-state gas distribution that is desired, i.e., when the gas pressure within the lower plenum volume reaches equilibrium. The variable radial flow conductance aspects of implementations discussed herein may be primarily used to affect the transient gas distribution in the lower plenum volume, i.e., when the gas pressure has not yet reached equilibrium within the lower plenum volume. Thus, the tunable radial flow conductance aspects of the implementations discussed herein may be used to tailor the transient gas flow regimes within the showerhead, and the gas distribution hole patterns/sizes may be used to tailor the steady-state gas flow regimes within the showerhead. For processes of short duration, such as thin-film deposition, the transient domain may be a more significant portion of the overall process interval and a showerhead with tunable radial flow conductance may provide a significant uniformity boost.

It is to be understood that while the focus of this discussion has been on using a variable radial flow conductance showerhead to promote more process uniformity, in some situations, it may be desirable to deliberately alter the radial flow conductance to promote less process uniformity, at least within a particular semiconductor processing step. For example, a semiconductor wafer may, at the start of a processing step, already possess non-uniform features. To correct such non-uniformity, a variable radial flow conductance showerhead may be configured to distribute gas in a non-uniform manner that produces a non-uniform layer deposition. This non-uniform layer deposition may, however, help "even out" the non-uniform thickness of a semiconductor substrate, and result in a substrate that is more uniform in overall appearance. Due to the large degree of tunability in a variable radial flow conductance showerhead, such strategies may be a practical path to addressing such substrate issues.

Figure 3C:
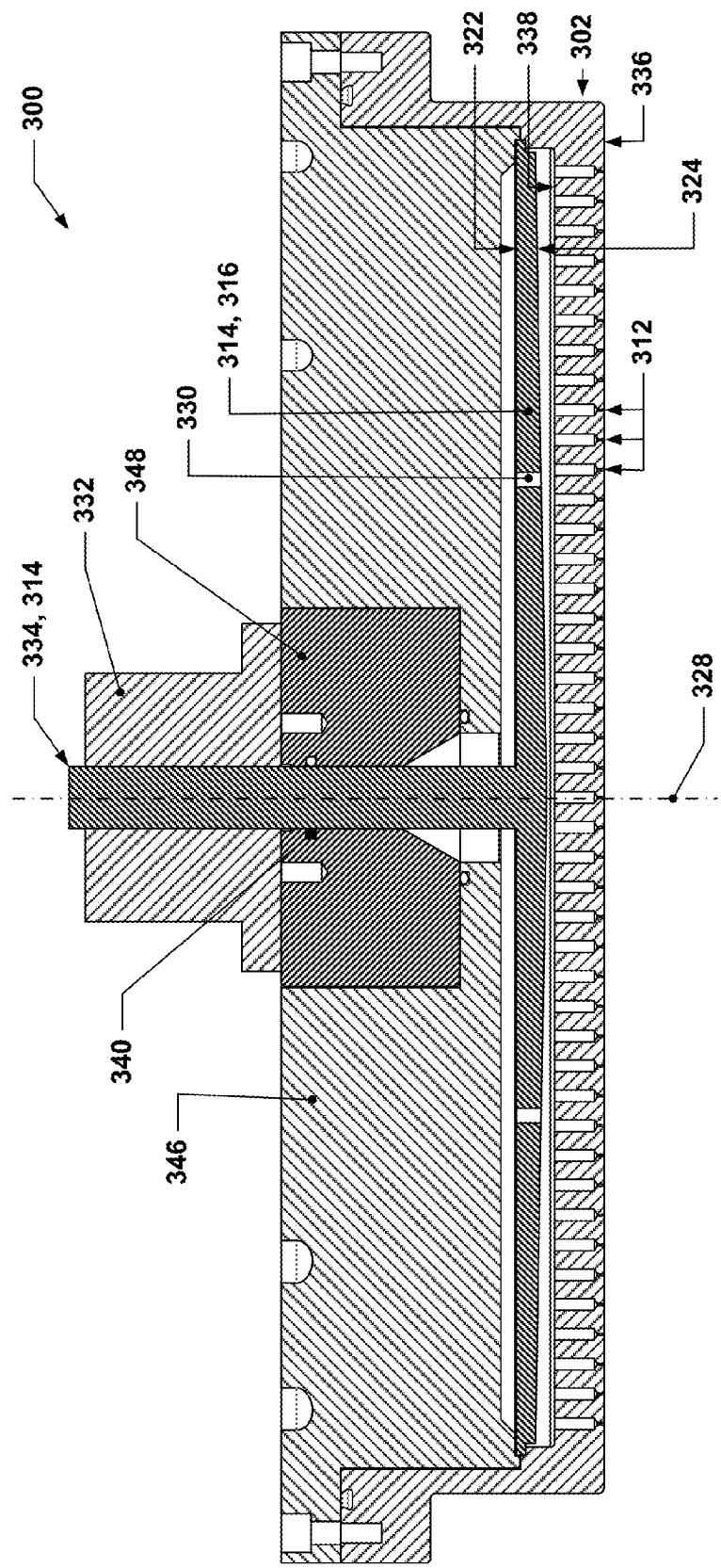
FIG. 3C depicts a side section view of the example showerhead from FIG. 3A.
Figure 3D:
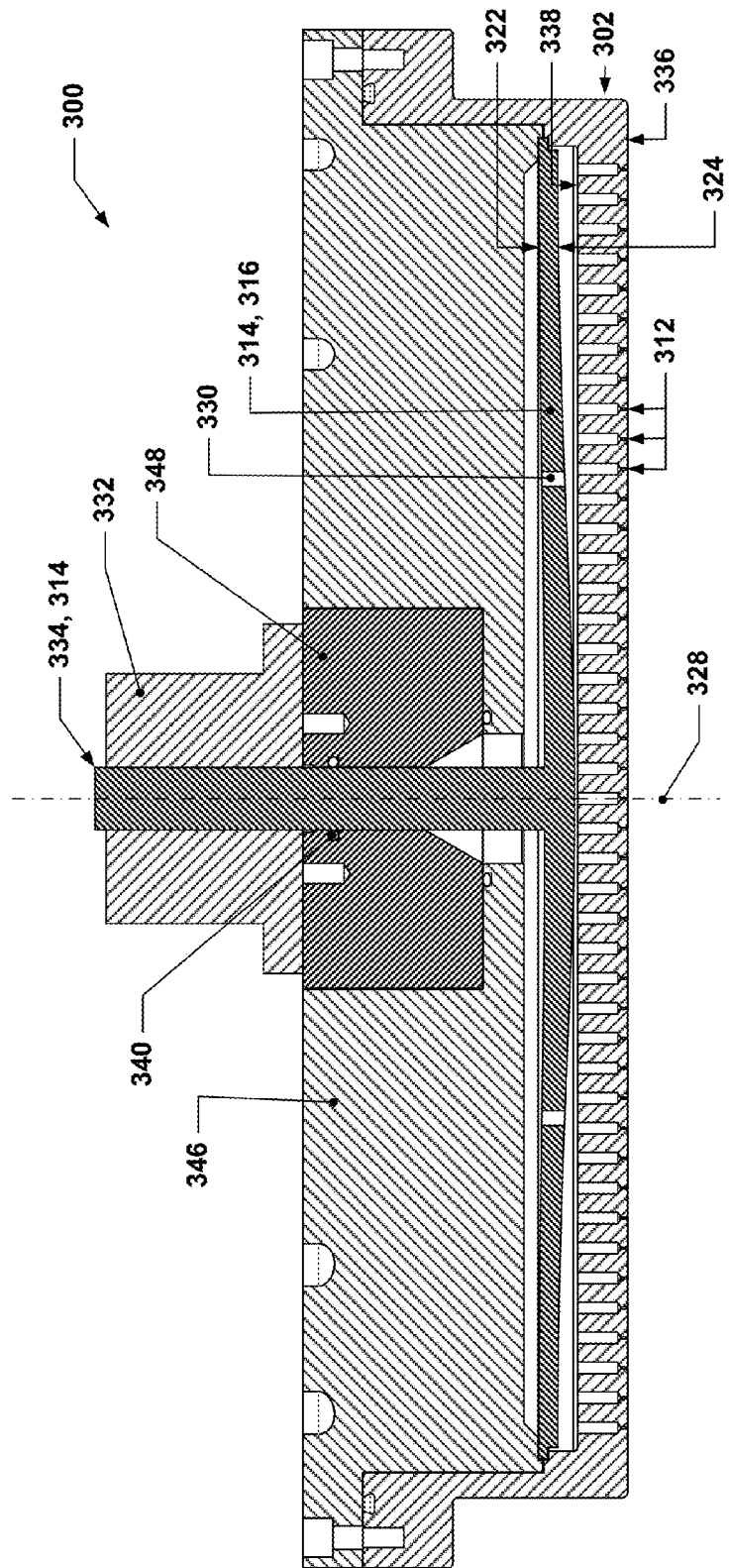
FIG. 3D depicts a side section view of the example showerhead from FIG. 3A with the baffle in a displaced condition.

FIG. 3C depicts a side section view of the example showerhead from FIG. 3A. FIG. 3D depicts a side section view of the example showerhead from FIG. 3A with the baffle in a displaced condition. As can be seen, relatively little change in separation distance between the faceplate 302 and the baffle 316 may be observed in response to the displacement of baffle 314 with respect to the faceplate 302.

In the implementation pictured in FIGS. 3A through 3D, for example, the separation distance between the baffle bottom surface 324 near the outer edge of the baffle and the faceplate top surface 338 may remain at a substantially fixed value, e.g., 3.75 mm, in both the displaced and the un-displaced state. The separation distance between the baffle bottom surface 324 and the faceplate top surface 338 near the center axis 328 may change when the baffle 314 is transitioned from the un-displaced state to the displaced state, e.g., from a distance of approximately 3.75 mm to a distance of 2.75 mm. The baffle 314 shown in this example may be approximately 13"/336 mm in diameter, and the through-holes 330 may be approximately 0.15"/3.8 mm in diameter and may be arranged on a 6.375"/162 mm diameter hole pattern centered on the center axis 328. The baffle bottom surface 324 may, as shown in FIGS. 3C and 3D, form a conical frustum with approximately a 178 degree cone angle.

The baffles described herein may be manufactured from a variety of materials, depending on the particular requirements of the environments to which they are to be subjected. Baffles may, for example, be made from aluminum, titanium, stainless steel, and possibly, in some cases, ceramics. Other materials that may be used for baffles include Teflon, polyimides, and other polymeric materials. In general, the material used for a baffle may be selected for resistance to attack by process gases used, tolerance of temperatures experienced within the showerhead, and elasticity sufficient to allow for flexure of the baffle without breakage. Due to the small displacements that may be imposed on the center of the baffles, brittle materials, such as ceramics, may nonetheless be suitable for use in some baffle designs. In some implementations, elements of the baffle may be made from different materials. For example, the baffle plate may be made from a polymer, and the center post, if used, may be made from aluminum.

In some configurations, a center post may be used that also acts as a gas inlet. For example, the top of the center post may be configured to mate with a gas supply line, and the center post may be hollow and have a plurality of ports about its circumference within the upper plenum volume. Process gas may be flowed into the gas inlet, through the center post, and into the upper plenum volume via the ports.

While the above discussion has focused on showerheads that feature a tunable radial flow conductance across the faceplate of the showerhead using a flexible baffle, some implementations may feature a static baffle that is contoured to provide a particular radial flow conductance. For example, in many semiconductor processes, once the optimum process parameters are established, it may be desirable to minimize the number of potential sources of variability. Thus, it may be undesirable to include a showerhead with a flexible baffle since this may be a source of variability. During development of such processes, however, a showerhead with a flexible baffle may be desired so as to allow for easy iterative testing of various baffle configurations. In such implementations, a showerhead with a flexible baffle and a tunable radial flow conductance may be used to "dial in" a desired radial flow conductance profile. Once a particular radial flow conductance profile is identified as optimal or desired, measurements of the displaced state of the baffle may be taken and used, for example, to manufacture a baffle that, in the unstressed state, has the same bottom surface contour as the bottom surface contour of the flexible baffle in the displaced state, i.e., stressed state, that produced the desired radial conductance profile. This pre-shaped baffle may then be produced in large quantities and installed in the equipment that will be performing the semiconductor process of interest. This eliminates the need to individually adjust each baffle in each semiconductor tool.

Figure 4:
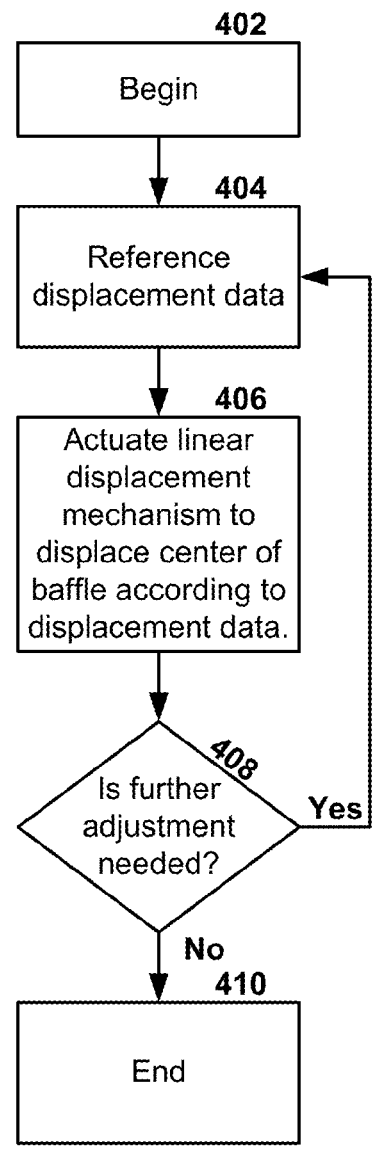
FIG. 4 depicts a flow diagram for one example technique for producing a static variable radial flow conductance showerhead baffle.

FIG. 4 depicts a flow diagram for one example technique for producing a static variable radial flow conductance showerhead baffle. After beginning in block 402, the technique involves measuring flow or substrate uniformity resulting from the performance of a particular semiconductor processing operation. In block 406, the measured uniformity (or lack thereof) is analyzed to determine whether the baffle needs to be displaced further or displaced less (or not at all). Such a determination may be made according to the general guidelines discussed herein. If the measured uniformity is not within acceptable levels in block 408, the technique may return to block 404 for further refinement of the baffle displacement. If the measured uniformity is within acceptable levels in block 408, the technique may next involve obtaining a profile of the deflected baffle in block 410. In block 412, a new baffle may be machined (or otherwise produced) that features the obtained profile when the baffle is in a substantially unstressed condition. In block 414, the new baffle may be installed in a semiconductor processing tool. The technique ends in block 416, after which the new baffle may be used during semiconductor processing operations involving the semiconductor processing tool.

The above discussion has focused primarily on showerhead implementations with internal volumes that are all in fluidic communication with each other within the showerhead. Various aspects of the tunable or static, tuned variable radial flow conductance technologies discussed above may also be implemented in showerheads that may be used to distribute two gases across a semiconductor substrate while keeping these gases fluidly isolated from each other within the showerhead, or at least isolated from each other within most of the showerhead. Such showerheads, which are often referred to as "dual plenum" showerheads (not to be confused with the lower plenum volume and the upper plenum volume formed by the flexible baffle showerheads discussed above), may feature a dual plenum volume bounded by an outer wall that may be partitioned into a first plenum volume and a second plenum volume by a series of radial barriers. The first plenum volume may be connected to a first process gas source and be used to distribute the first process gas across a semiconductor substrate using a plurality of plenum gas distribution holes passing from the first plenum volume through the outer wall. The second plenum volume may be connected to a second process gas source and be used to distribute the second process gas source across the semiconductor substrate in a similar manner.

Figure 7A:
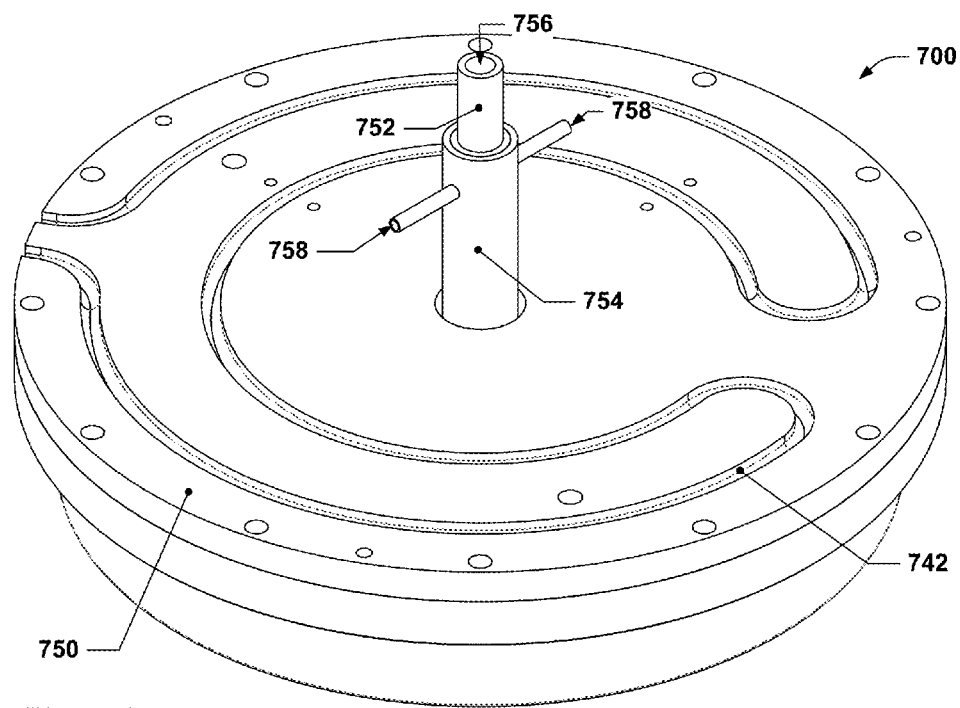
FIG. 7A depicts an isometric view of a dual-plenum showerhead configured to provide variable radial flow resistance within the showerhead plenums.

FIG. 7A depicts an isometric view of a dual-plenum showerhead configured to provide variable radial flow resistance within the showerhead plenums. In FIG. 7A, a showerhead 700 is depicted. The showerhead 700 includes a coned backplate 750 (the coned aspect is visible in later Figures), which may include a heater loop channel 742. A first gas feed tube 752 may be coaxially located with respect to a second gas feed tube 754, thus creating an annular volume between the first gas feed tube 752 and the second gas feed tube 754 that is capped off near the protruding end of the first gas feed tube 752 or the second gas feed tube 754. The first process gas may be fed into a first interior volume of the first gas feed tube 752 via a first inlet or inlets 756. The second process gas may be fed into a second interior volume, e.g., the annular volume between the first gas feed tube 752 and the second gas feed tube 754, via a second inlet or inlets 758.

Figure 7B:
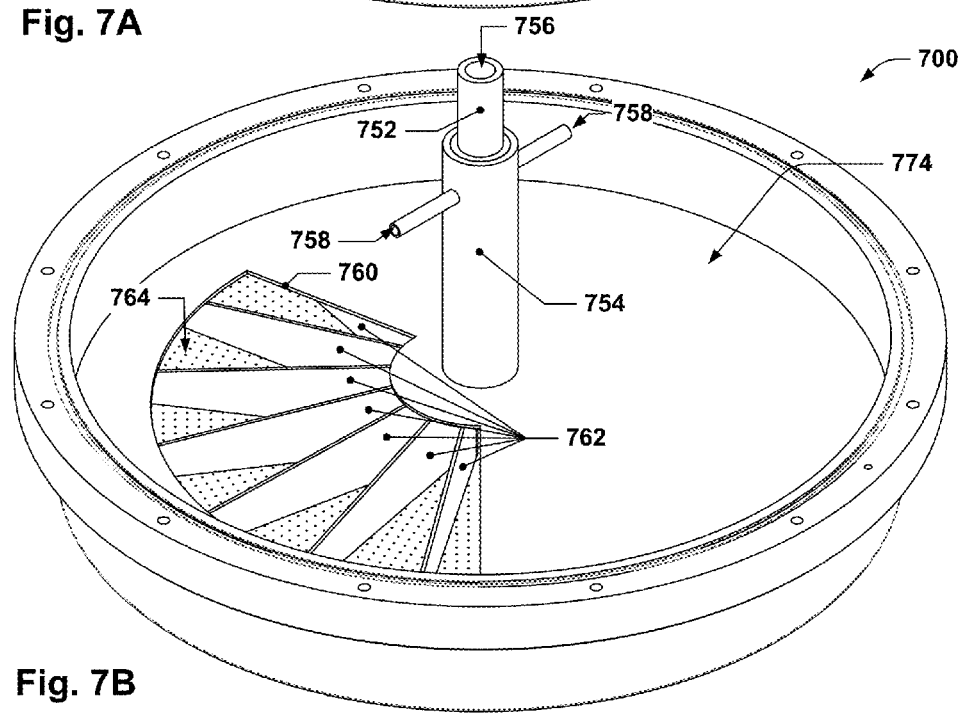
FIG. 7B depicts an isometric view of the dual-plenum showerhead of FIG. 7A with the backplate removed and with a portion of the outer wall removed to allow viewing of the radial barriers.

FIG. 7B depicts an isometric view of the dual-plenum showerhead of FIG. 7A with the backplate removed and with a portion of the outer wall removed to allow viewing of the radial barriers. As can be seen, beneath the coned backplate 750 lies a dual plenum volume that is contained within an outer wall 760. The outer wall 760 may, as in this implementation, be a substantially axially symmetric, thin-wall vessel that substantially spans the width of the showerhead 700. The outer wall 760 may define the outer boundaries of the dual plenum volume. The outer wall 760 may also house a number of radial barriers 762 that extend substantially from the outermost interior surface of the outer wall 760 towards the center of the dual plenum volume.

The radial barriers 762 may define an even-numbered, radial array of sub-volumes. Each sub-volume may include a pattern of plenum gas distribution holes 764 that pass from the sub-volume, through the outer wall, and in the direction that a wafer would lie during semiconductor processing. In the example, shown, there are a total of 16 sub-volumes, although, in other implementations, the number of sub-volumes may range between 10 and 24 (in even increments). In theory, there may be no upper limit on the number of sub-volumes, although the thickness of the radial barriers 762 may, in practice, limit the number of sub-volumes.

Figures 8A, 8B:
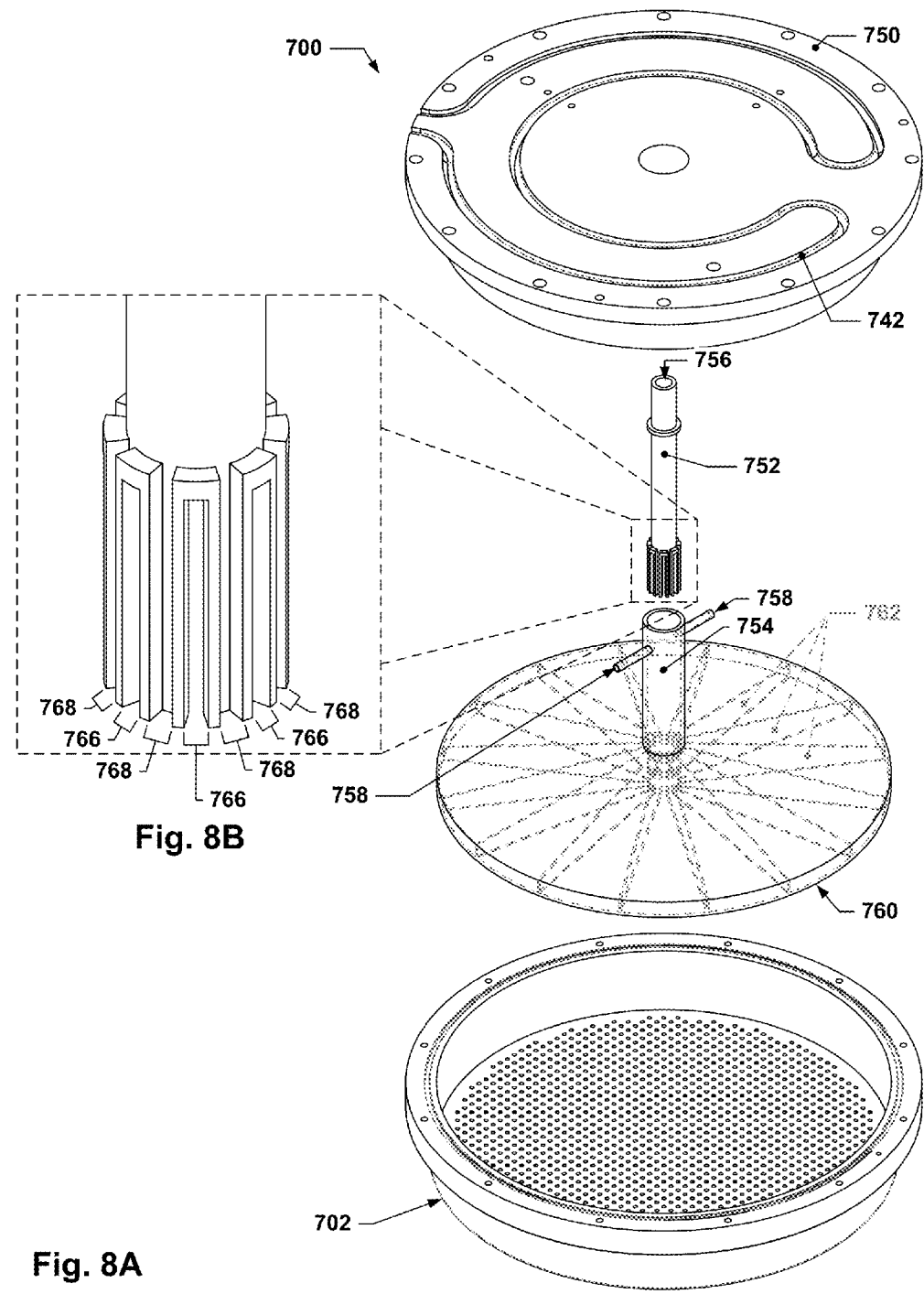
FIG. 8A depicts an isometric exploded view of the dual-plenum showerhead of FIG. 7A.
FIG. 8B shows an isometric detail view of the first gas feed tube shown in FIG. 8A.

FIG. 8A depicts an isometric exploded view of the dual-plenum showerhead of FIG. 7A. The outer wall 760 and the components within it are shown with hidden lines visible to allow the radial barriers 762 to be easily seen. In this implementation, the second gas feed tube 754 is joined to the outer wall 760 at the base and the first gas feed tube 752, when assembled, may be slid into the second gas feed tube 754 and then brazed into place. This may allow the mating surfaces of the first gas feed tube 752, the second gas feed tube 754, and the radial barriers 762 to be fused together in a gas-impermeable manner, thus fluidly isolating the first interior volume and the second interior volume from each other within the showerhead.

FIG. 8B shows an isometric detail view of the first gas feed tube shown in FIG. 8A. As can be seen, the base of the first gas feed tube 752 may have a stepped-up diameter that substantially matches the internal diameter of the second gas feed tube 754. A radial array of longitudinal grooves in the stepped-up diameter region may be arranged about the center axis of the first gas feed tube 752. These grooves may allow gas that is present in the second interior volume to flow out of the second interior volume, into the stepped region, and then in a radial direction away from the first gas feed tube 752. The grooves are not deep enough, however, to breach the inner wall of the first gas feed tube 752.

A similar array of longitudinal slots may also be present in the stepped up region. The longitudinal slots may pierce the inner wall of the first gas feed tube 752, thus allowing gas that is present in the first interior volume to flow out of the first interior volume, through the stepped region, and in a radial direction away from the first gas feed tube 752. The longitudinal slots may form a radial array of first radial passages 766, and the longitudinal grooves may for a radial array of second radial passages 768. Other configurations of parts may be used as well to produce substantially the same result, i.e., a two-gas feed system that, at one end, distributes the two different gases used in radial directions and in an alternating, segregated manner, and this disclosure should not be viewed as being limited to the particular implementation shown in the Figures.

Also visible in FIG. 8A is faceplate 702, which may be similar to the faceplate 202 discussed earlier. However, it is to be understood that, in some implementations, the bottom surface of the outer wall 760 may serve the same purpose as the faceplate 702, and a separate faceplate 702 may therefore be unneeded.

Figure 9:
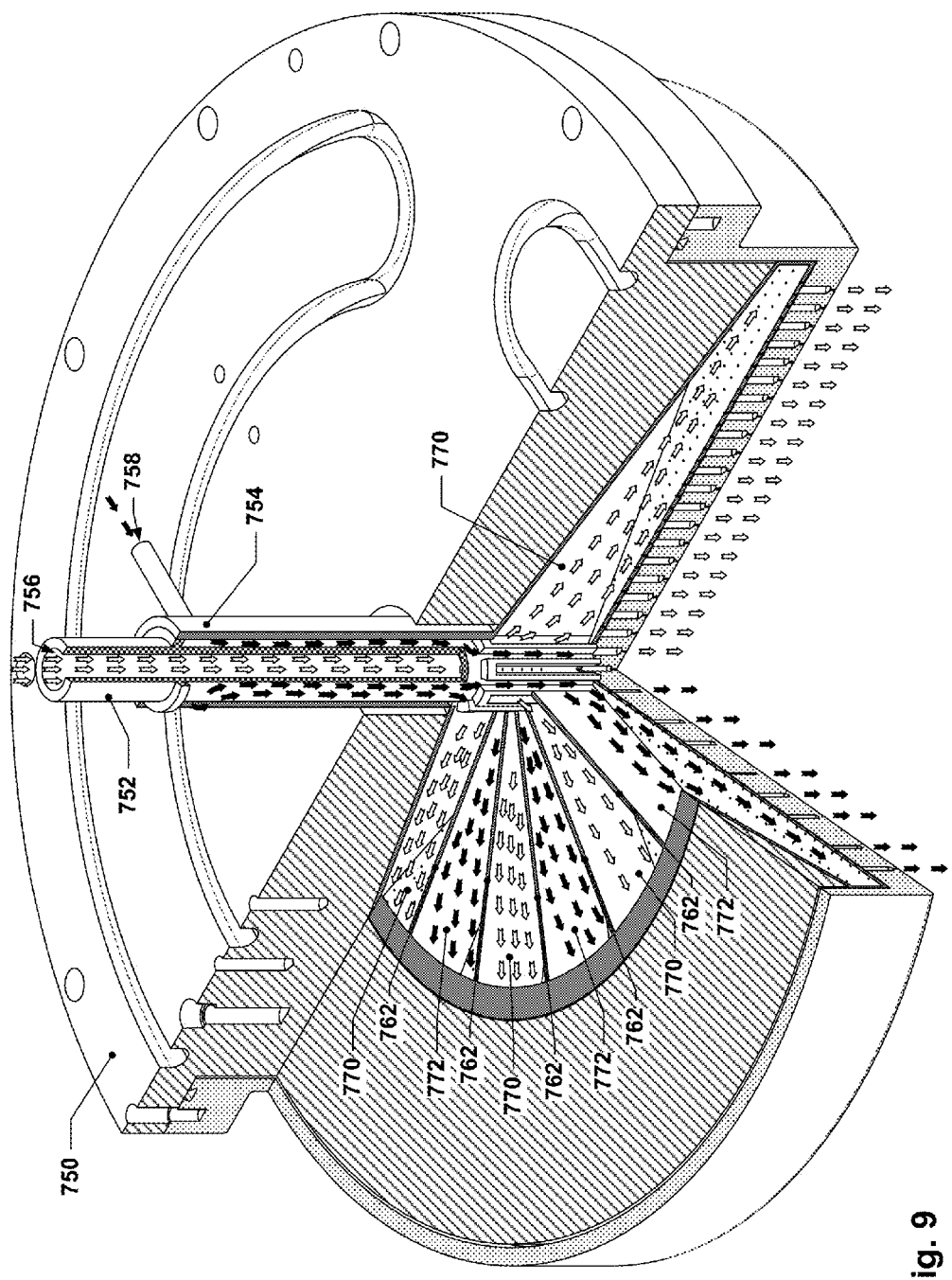
FIG. 9 depicts an isometric, multi-section cutaway view of the dual-plenum showerhead of FIG. 7A.

FIG. 9 depicts an isometric, multi-section cutaway view of the dual-plenum showerhead of FIG. 7A. In FIG. 9, the showerhead 700 is shown with various portions sectioned away to allow for easier viewing of the internal structures of the showerhead 700. For example, a wedge-shaped section of the first gas feed tube 752 has been cut away from the top of the first gas feed tube 752 to a point just above the stepped region. The remaining parts have been sectioned along the axial midplanes of the showerhead to a point approximately halfway along the longitudinal slots/grooves in the stepped region. A further wedge-shaped section of the remaining components has also been removed to allow for further interior viewing.

In FIG. 9, white arrows depict notional gas flow of the first process gas through the first gas feed tube 752, through the longitudinal slots, and into the "odd" sub-volumes 770. Black arrows depict notional gas flow of the second process gas through the second gas feed tube 754, through the longitudinal grooves, and into the "even" sub-volumes 772. Once introduced into the odd sub-volumes 770 and the even sub-volumes 772, the respective gases may flow through the sub-volumes and towards the periphery of the outer wall 760. The radial flow conductance of the gases may be tuned, for example, to offset the potential increase in flow conductance due to the expanding circumferential width of the sub-volumes as one traverses the sub-volumes towards the outer wall 760. This may be accomplished by sloping the outer wall 760 so that the sub-volumes decrease in height as the distance to the outer wall 760 decreases. This increases the radial flow resistance due to the height of the sub-volumes at the same time that the radial flow resistance due to the width of the sub-volumes may be decreasing. Of course, other configurations of outer wall may be used as well, depending on the gas flow behavior desired. For example, the outer wall 760 could, instead, increase in height as one approaches the outer perimeter of the outer wall 760. Non-linear outer wall profiles may also be used to adjust the gap, and thus the radial flow conductance, between the portions of the outer wall 760 forming the "top" and "bottom" of the dual plenum volume 774.

It is to be understood that an "even" or "odd" sub-volume may alternatively be used to refer to a grouping of adjacent sub-volumes that are all used to distribute the same gas. For example, in some implementations, each sub-volume may be further subdivided into sub-sub-volumes volumes, or there may be two sub-volumes adjacent to each other that may, in effect, be viewed as a single sub-volume since they are both fed from the same gas feed tube.

As depicted in FIG. 9, the bottom of the dual plenum volume 760 featuring the plenum gas distribution holes 764 is in contact with the faceplate 702. In such implementations, the plenum gas distribution holes 764 may be distributed in a pattern corresponding to the pattern of gas distribution holes 712 in the faceplate 702. While such a matching pattern is not shown in the implementation depicted in FIG. 9, it is to be understood that such an implementation is within the scope of this disclosure. Additionally, as discussed previously, some implementations may do away with the faceplate 702 entirely, and simply use the bottom portion of the outer wall 760 to provide gas distribution functionality.

In some other implementations, however, the bottom of the outer wall 760 may be offset from the faceplate 702 by a gap, providing a space in between the faceplate 702 and the dual plenum volume 774 within which the gases exiting the odd sub-volumes 770 and the even sub-volumes 772 may pre-mix prior to passing through the gas distribution holes 712 in the faceplate 702 and towards a wafer being processed using the showerhead 700. Such an implementation is not depicted in the Figures, but is to be understood to be within the scope of this disclosure.

Such pre-mixing may result in a more uniform gas distribution across a wafer that is being processed using the showerhead 700. Dual plenum showerheads are typically used to segregate two precursors and prevent premature intermixing and reaction of the precursors. When such precursors intermix, condensation may be formed under certain environmental conditions, e.g., sub-dew point conditions. While forming such condensation on the wafer may be desirable, it may be undesirable if the condensation forms within the showerhead 700. Heating the showerhead 700 via a heater element routed in the heater loop channel 742 may elevate the temperatures within the dual plenum volume to a point above the dew point, preventing premature condensation.

Figure 10A:
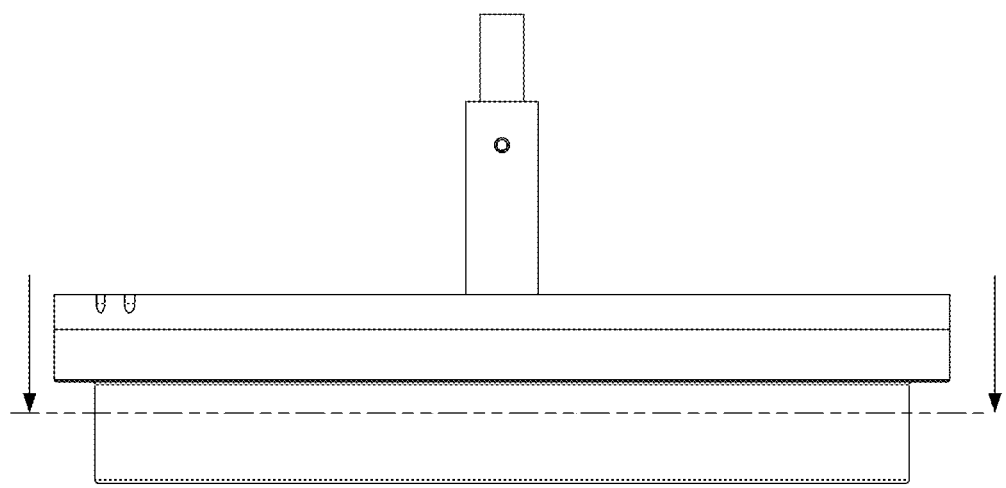
FIG. 10A depicts a side view of the dual-plenum showerhead of FIG. 7A.
Figure 10B:
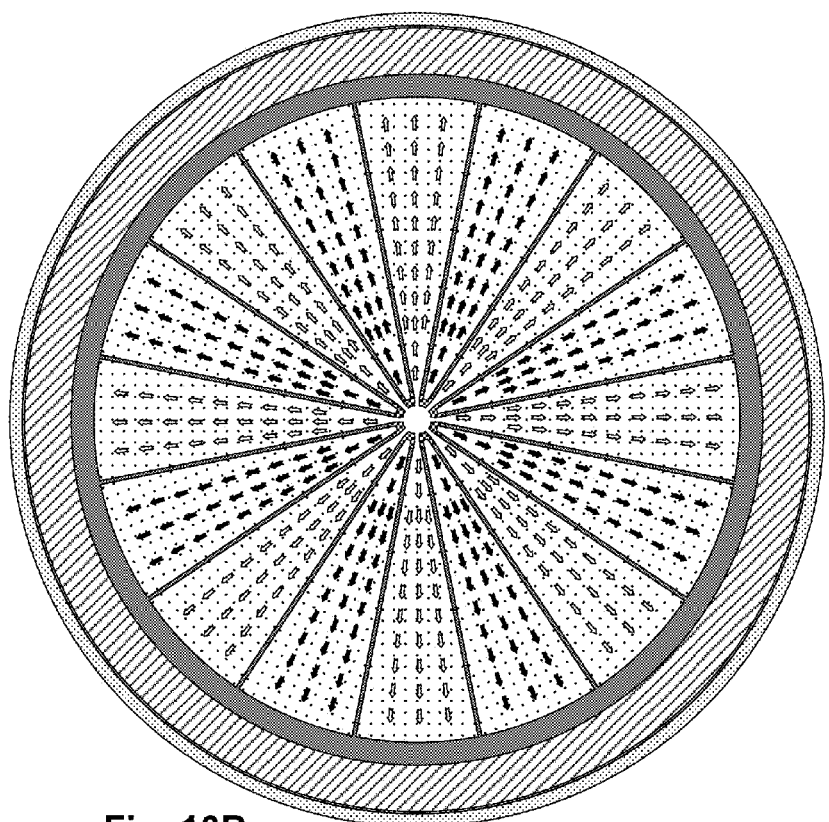
FIG. 10B depicts a section view of the dual-plenum showerhead of FIG. 10A.

FIG. 10A depicts a side view of the dual-plenum showerhead of FIG. 7A. FIG. 10B depicts a section view of the dual-plenum showerhead of FIG. 10A. As can be seen in the section view, the two gases are distributed in a repeating, interleaved radial pattern.

Figure 11A:
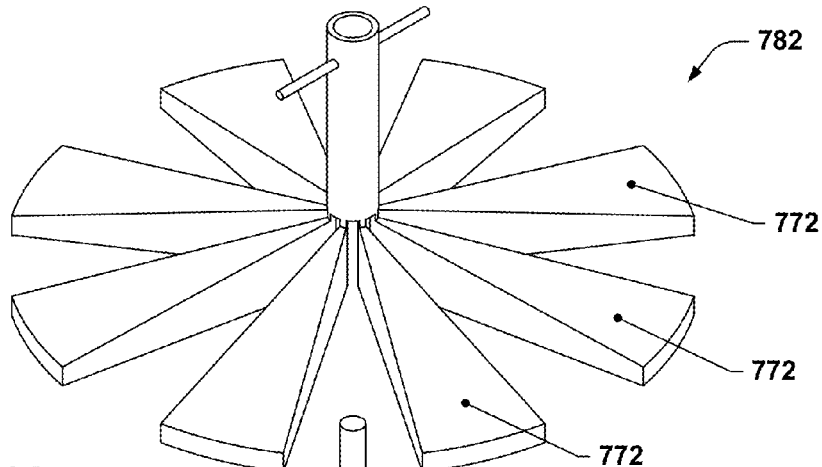
FIG. 11A depicts one of the two plenum volumes of a dual-plenum showerhead.

FIG. 11A depicts a second plenum volume 782 including the even sub-volumes 772 and the second interior volume 778. It is to be understood that the second plenum volume 782 shown is not actually a component, but an internal "free" volume defined by the various components described in FIGS. 7A through 10B. The second plenum volume 782 represents the volume, for example, within which the second gas may fluidly flow within the dual plenum volume 774.

Figure 11B:
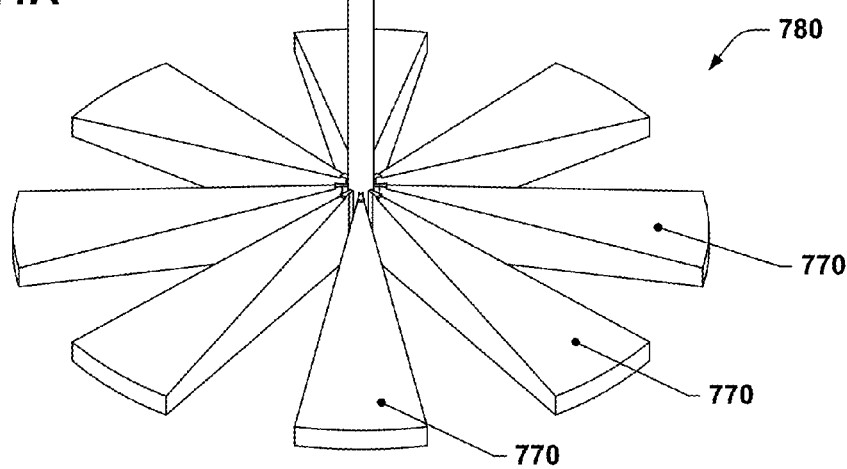
FIG. 11B depicts a complementary plenum volume to the plenum volume shown in FIG. 11A.

FIG. 11B depicts a first plenum volume 780. It is also to be understood that the first plenum volume 780 shown is not actually a component, but an internal "free" volume defined by the various components described in FIGS. 7A through 10B. The first plenum volume 780 represents the volume, for example, within which the first gas may fluidly flow within the dual plenum volume 774.

Figure 11C:
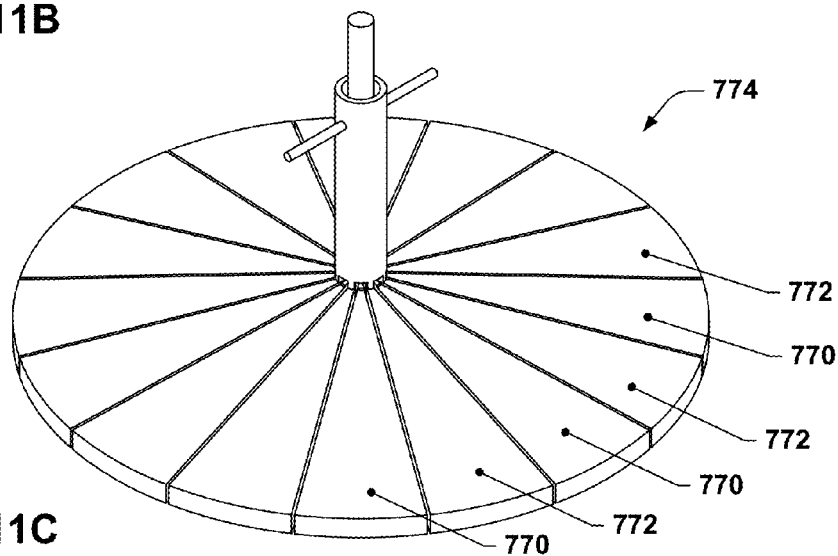
FIG. 11C depicts the dual plenum volume including both plenum volumes shown in FIGS. 11A and 11B.

FIG. 11C depicts the dual plenum volume including both plenum volumes shown in FIGS. 11A and 11B. In this Figure, the first plenum volume 780 and the second plenum volume 782 are positioned according to their relative positioning within the dual plenum volume 774. As can be seen, the first plenum volume 780 and the second plenum volume 782 are intermeshed with one another but do not intersect one another.

As discussed above, some implementations may feature a powered, actively-controlled linear displacement mechanism controlled by a controller. The controller may include a specially-programmed computing device, e.g., a device that functions according to software instructions stored on/in a machine readable medium, e.g., on a hard disk, memory device, CD or DVD, network storage system, etc. Such instructions may be executable by one or more processors of the computing device and may be used to cause the linear displacement mechanism to displace the center of the baffle by various amounts during various stages of a semiconductor process.

In some implementations, the controller may operate in an open-loop manner, e.g., the controller may be pre-programmed with defined displacement distances for the linear displacement mechanism, each associated with a different phase of a semiconductor process, and may control the motion of the linear displacement mechanism according to these defined distances.

Figure 5:
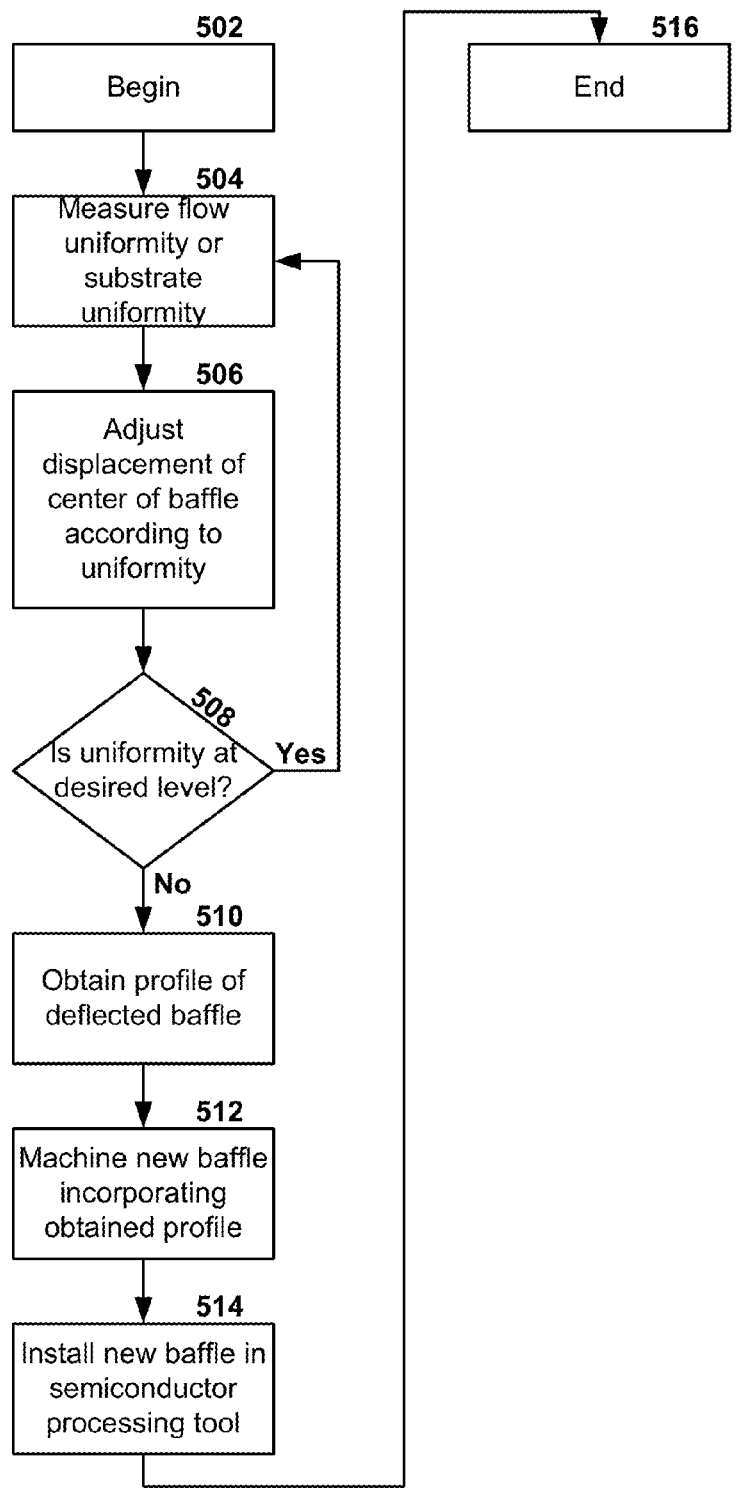
FIG. 5 depicts a flow diagram for one example open-loop technique for controlling a variable radial flow conductance showerhead.

FIG. 5 depicts a flow diagram for one example open-loop technique for controlling a variable radial flow conductance showerhead. The technique may begin in block 502. In block 504, displacement data, e.g., a defined displacement distance, may be referenced by a controller. In block 506, a linear displacement mechanism may be actuated to cause the baffle in the variable radial flow conductance showerhead to be displaced by the defined displacement distance. It should be noted that the displacement distance, while perhaps provided with respect to any of several coordinate frames, ultimately defines, either directly or indirectly, the separate distance between the bottom surface of the baffle and the top surface of the faceplate. In block 508, a determination is made as to whether further displacement is needed. For example, if a later semiconductor processing phase requires a different displacement, the technique may return to block 504 and new displacement data may be referenced. If further displacement adjustment is not needed, the technique ends in block 510. This technique may be repeatedly performed for successive substrates processed in a semiconductor processing tool equipped with the variable radial flow conductivity showerhead.

In some other implementations, however, the controller may operate in a closed-loop manner, e.g., the controller may receive feedback regarding process variability during the semiconductor process, or periodically in between semiconductor processes, and adjust the amount of linear displacement used during various stages of the semiconductor process accordingly. For example, measurements of gas distribution across the faceplate may be taken and if the gas distribution is biased towards the outside of the wafer, the radial flow conductance within the showerhead may be increased towards the center of the faceplate. If the gas distribution is biased towards the center of the wafer, the radial flow conductance within the showerhead may be decreased towards the center of the faceplate.

Another technique that may be used is to measure the gap distance dynamically, e.g., using an optical vacuum feedthrough and a laser gap measurement device, and then adjust the displacement of the baffle such that the measured gap distance approaches a desired value. Such desired gap values may be determined experimentally.

Another technique may involve evaluating semiconductor substrates processed using the variable radial flow conductance showerhead wafers for non-uniformity, e.g., in-line metrology, and then adjusting the radial flow conductance of the showerhead based on measurements performed on the semiconductor substrate. Thus, if a semiconductor substrate processed using such a showerhead exhibits a non-uniformity, the radial flow conductance may be adjusted as needed for subsequent semiconductor substrate processing operations. This will not address the non-uniformity in the evaluated substrate, but may improve the uniformity of subsequently-processed substrates. Such evaluation and variable radial flow conductance adjustment may be performed at regular intervals, resulting in a semi-closed-loop feedback system.

Figure 6:
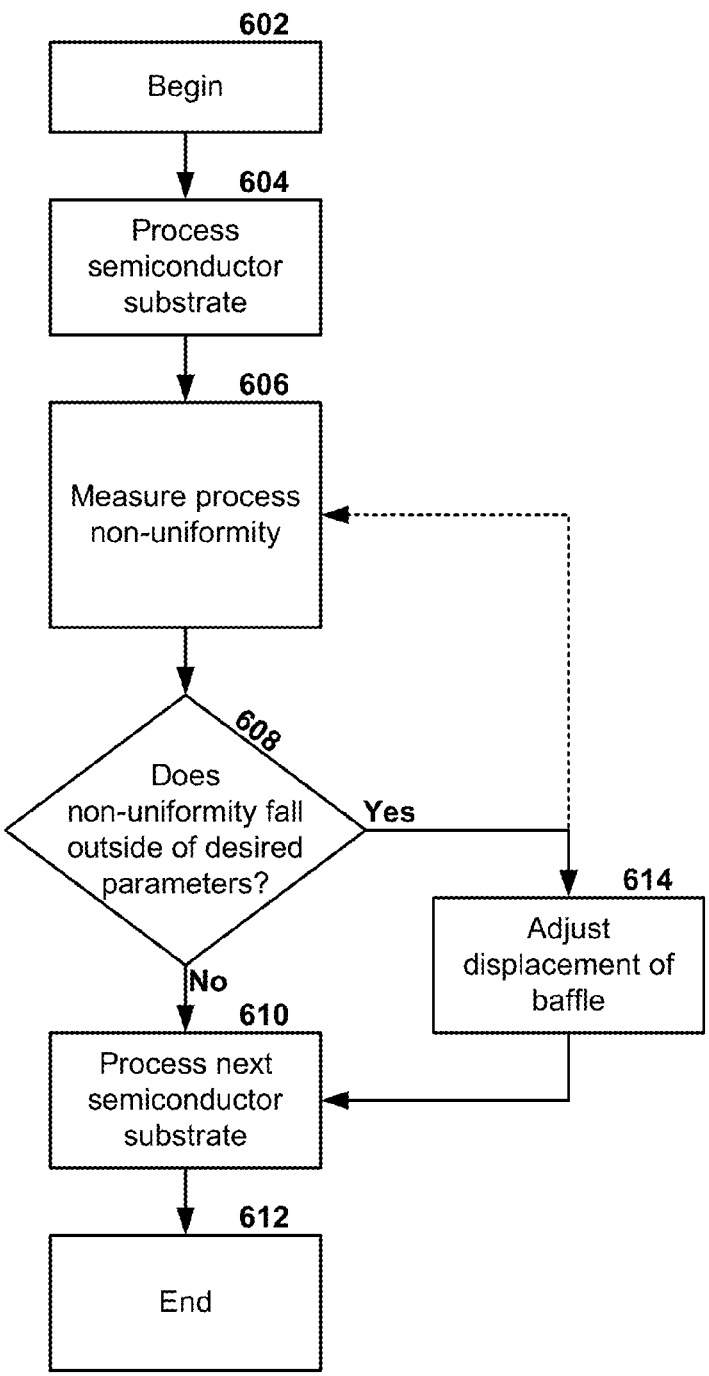
FIG. 6 depicts a flow diagram for one example closed-loop technique for controlling a variable radial flow conductance showerhead.

FIG. 6 depicts a flow diagram for one example closed-loop technique for controlling a variable radial flow conductance showerhead. The technique may begin in block 602, and may involve processing a semiconductor substrate with a variable radial flow conductance showerhead set to a particular baffle displacement (or baffle/faceplate separation distance). In block 606, an evaluation of process non-uniformity (or uniformity) may be made. This, for example, may involve in-situ measurement of gas flow distribution, or in-line metrology measurements of semiconductor substrate layers. In block 608, a determination may be made as to whether the measured non-uniformity or uniformity falls outside of desired parameters. If so, the baffle/faceplate separation distance may be adjusted, accordingly, in block 614 for a following semiconductor substrate (or, for in-situ measurements, for the semiconductor substrate currently being processed). After adjustment (or if no adjustment is needed), the technique may proceed to block 610, where a subsequent semiconductor substrate may be processed. In the case of in-situ measurement, the technique may optionally return to block 606, where a further measurement may be taken and further adjustments may be made. The technique may end in block 612.

The variable radial flow conductance showerheads described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a substrate stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

In some implementations, a variable radial flow conductance showerhead may be used with flowable oxide processes. In existing flowable oxide processes, a dual-zone showerhead is sometimes used to provide different flow characteristics near the center of the faceplate as compared with an annular region about the center region of the faceplate. Dual zone showerheads may feature an annular wall inside of the showerhead that mates with the top surface of the faceplate. The annular wall divides the showerhead internal volume into a central plenum (within the annular wall) and an annular plenum (outside of the annular wall). Different process gas feeds may supply the central plenum and the annular plenum, and each zone of the dual zone showerhead may be fed from gas distribution holes from a different one of the plenums. A dual zone showerhead may, however introduce a localized discontinuity in the transition region between the two zones, however, due to the sudden change in process gas properties that may result from the presence of the annular wall. A variable radial flow conductance showerhead, by contrast, may avoid such localized discontinuities since the lower plenum volume may be continuous across the top surface of the faceplate.

In some implementations, a variable radial flow conductance showerhead may be installed in a reactor and linked to a system controller having instructions for controlling process operations. The system controller will typically include one or more memory devices and one or more processors configured to execute the instructions so that the apparatus will perform various semiconductor fabrication processes. Machine-readable media containing instructions for controlling process operations may be coupled to the system controller. The processors may include a CPU or computer and may include or be communicatively connected with one or more analog and/or digital input/output connections, stepper motor controller boards, etc. The system controller, for example, may be configured to, in addition to controlling radial flow conductance in the showerhead via linear displacement of the center of the baffle, control gas delivery to the showerhead, pedestal/substrate support movement, vacuum port suction to evacuate gas from the reactor, power and frequency to the plasma electrodes, and/or heating and cooling elements, if present in a particular implementation.

There will typically be a user interface associated with the system controller. The user interface may include a display screen, graphical software displays of the apparatus and/or process conditions, and user input devices such as pointing devices, keyboards, touch screens, microphones, etc. The system controller may be connected to any or all of the components shown in of a tool or module, including those shown in the Figures of this application; the system controller's placement and connectivity may vary based on the particular implementation.

In certain implementations, the system controller controls the pressure in various processing chambers in a tool. The system controller may also control the concentration of various process gases in the chamber by regulating valves, liquid delivery controllers, and MFCs in the delivery system as well as flow restriction valves in an exhaust line. The system controller executes system control software including sets of instructions for controlling the timing, flow rates of gases and liquids, chamber pressure, chamber/showerhead/pedestal/substrate temperature, and/or other parameters of a particular process. Other computer programs stored on memory devices associated with the controller may be employed in some implementations. In certain implementations, the system controller controls the transfer of a substrate into and out of the various apparatuses shown in the figures.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

Although several implementations of this invention have been described in detail herein with reference to the accompanying drawings, it is to be understood that the invention is not limited to these precise implementations, and that various changes and modifications may be effected therein by one skilled in the art without departing from the scope of spirit of the invention as defined in the appended claims.

What is claimed is:

1. An apparatus comprising:
   an outer wall, the outer wall substantially axially symmetric about a first axis;
   a first inlet;
   a second inlet; and
   a dual plenum volume substantially defined by the outer wall, the dual plenum volume divided into an even number of sub-volumes by radial barriers substantially extending from locations proximate to the first axis to the outer wall, wherein:
   the sub-volumes include a set of first sub-volumes and a set of second sub-volumes,
   each first sub-volume is interposed between neighboring second sub-volumes of the set of second sub-volumes,
   each second sub-volume is interposed between neighboring first sub-volumes of the set of first sub-volumes,
   each sub-volume has a plurality of plenum gas distribution holes passing through a bottom portion of the outer wall,
   the first sub-volumes form a first plenum volume,
   the second sub-volumes form a second plenum volume,
   the first inlet is configured to supply a first process gas to the first sub-volumes,
   the second inlet is configured to supply a second process gas to the second sub-volumes,
   the first plenum volume is fluidically isolated from the second plenum volume between the plenum gas distribution holes and the first inlet, and
   the second plenum volume is fluidically isolated from the first plenum volume between the plenum gas distribution holes and the second inlet.

2. The apparatus of claim 1, wherein the sub-volumes are all substantially the same size and overall shape.

3. The apparatus of claim 1, wherein one or more of the sub-volumes is further partitioned into two or more sub-sub-volumes by one or more additional radial barriers and wherein each of the sub-sub-volumes of a sub-volume is configured to be supplied the same process gas.

4. The apparatus of claim 1, further comprising:
a first gas feed tube with a first interior volume, and
a second gas feed tube, wherein:
the first gas feed tube is concentric with the second gas feed tube, thereby creating an annular, second interior volume between the first gas feed tube and the second gas feed tube,
the first interior volume is configured to convey the first process gas from the first inlet to the first sub-volumes, and
the second interior volume is configured to convey the second process gas from the second inlet to the second sub-volumes.

5. The apparatus of claim 4, wherein the first gas feed tube includes a stepped-up region where the diameter of the first gas feed tube is larger than the diameter of the first gas feed tube.

6. The apparatus of claim 5, wherein the stepped-up region includes channels that extend in a direction parallel to the first axis, wherein:
each channel is in fluidic communication with the second interior volume, and
each channel serves as a fluidic connection between the second interior volume and one of the second sub-volumes.

7. The apparatus of claim 6, wherein the stepped-up region includes slots that extend radially from the first interior volume and through the first gas feed tube, wherein:
each slot is in fluidic communication with the first interior volume, and
each slot serves as a fluidic connection between the first interior volume and one of the first sub-volumes.

8. The apparatus of claim 7, wherein each slot is interposed between neighboring channels and each channel is interposed between neighboring slots.

9. The apparatus of claim 1, wherein the sub-volumes decrease in height along the first axis as a function of radial position with respect to the first axis.

10. The apparatus of claim 1, wherein the sub-volumes increase in height along the first axis as a function of radial position with respect to the first axis.

11. The apparatus of claim 1, wherein there are at least 10 sub-volumes.

12. The apparatus of claim 1, wherein the number of sub-volumes is an even number of sub-volumes greater than or equal to 10 sub-volumes and less than or equal to 24 sub-volumes.

13. The apparatus of claim 1, further comprising a faceplate, wherein the faceplate includes a plurality of gas distribution holes through the faceplate and is positioned such that openings of the gas distribution holes face the plenum gas distribution holes in the outer wall.

14. A semiconductor processing tool comprising:
a semiconductor processing chamber; and
a dual-plenum showerhead, the dual-plenum showerhead including:
an outer wall, the outer wall substantially axially symmetric about a first axis;
a first inlet;
a second inlet; and
a dual plenum volume substantially defined by the outer wall, the dual plenum volume divided into an even number of sub-volumes by radial barriers substantially extending from locations proximate to the first axis to the outer wall, wherein:
the sub-volumes include a set of first sub-volumes and a set of second sub-volumes,
each first sub-volume is interposed between neighboring second sub-volumes of the set of second sub-volumes,
each second sub-volume is interposed between neighboring first sub-volumes of the set of first sub-volumes,
each sub-volume has a plurality of plenum gas distribution holes passing through a bottom portion of the outer wall,
the first sub-volumes form a first plenum volume,
the second sub-volumes form a second plenum volume,
the first inlet is configured to supply a first process gas to the first sub-volumes,
the second inlet is configured to supply a second process gas to the second sub-volumes,
the first plenum volume is fluidically isolated from the second plenum volume between the plenum gas distribution holes and the first inlet,
the second plenum volume is fluidically isolated from the first plenum volume between the plenum gas distribution holes and the second inlet, and
the dual-plenum showerhead is configured to deliver the first process gas and the second process gas to a semiconductor wafer when the semiconductor wafer within the semiconductor processing chamber.

15. The semiconductor processing tool of claim 14, wherein the faceplate is offset from the outer wall in a direction parallel to the first axis by a gap.

16. The apparatus of claim 14, wherein the sub-volumes are all substantially the same size and overall shape.

17. The apparatus of claim 14, wherein one or more of the sub-volumes is further partitioned into two or more sub-sub-volumes by one or more additional radial barriers and wherein each of the sub-sub-volumes of a sub-volume is configured to be supplied the same process gas.

18. The apparatus of claim 1, wherein the sub-volumes decrease in height along the first axis as a function of radial position with respect to the first axis.

19. The apparatus of claim 1, wherein the sub-volumes increase in height along the first axis as a function of radial position with respect to the first axis.

20. The apparatus of claim 1, wherein the number of sub-volumes is an even number of sub-volumes greater than or equal to 10 sub-volumes and less than or equal to 24 sub-volumes.

* * * * *

UNITED STATES PATENT AND TRADEMARK OFFICE
CERTIFICATE OF CORRECTION

PATENT NO. : 9,728,380 B2
APPLICATION NO. : 14/802027
DATED : August 8, 2017
INVENTOR(S) : Jonathan D. Mohn et al.

Page 1 of 1

It is certified that error appears in the above-identified patent and that said Letters Patent is hereby corrected as shown below:

In the Claims

Claim 5 (Column 19, Line 23), change "gas feed tube is larger than the diameter of the first gas feed" to --gas feed tube is larger than the diameter of an adjoining portion of the first gas feed--.

Claim 15 (Column 20, Line 42), change "wherein the faceplate that is offset from the outer wall in" to --further comprising a faceplate that is offset from the outer wall in--.

Signed and Sealed this
Twenty-third Day of June, 2020

Andrei Iancu
*Director of the United States Patent and Trademark Office*